(12) United States Patent
Park et al.

(10) Patent No.: US 12,713,575 B2
(45) Date of Patent: Aug. 18, 2026

(54) SEMICONDUCTOR DEVICE AND METHOD FOR FABRICATING THE SAME

(71) Applicant: SK hynix Inc., Gyeonggi-do (KR)

(72) Inventors: Bo Min Park, Gyeonggi-do (KR); Wan Sup Shin, Gyeonggi-do (KR); Seung Mi Yeo, Gyeonggi-do (KR)

(73) Assignee: SK hynix Inc., Gyeongi-do (KR)

( * ) Notice: Subject to any disclaimer, the term of this patent is extended or adjusted under 35 U.S.C. 154(b) by 359 days.

(21) Appl. No.: 18/585,516

(22) Filed: Feb. 23, 2024

(65) Prior Publication Data

US 2025/0063717 A1 Feb. 20, 2025

(30) Foreign Application Priority Data

Aug. 14, 2023 (KR) ........................ 10-2023-0106199

(51) Int. Cl.
*H10B 12/00* (2023.01)
*H10W 20/00* (2026.01)

(52) U.S. Cl.
CPC ......... *H10B 12/033* (2023.02); *H10B 12/482* (2023.02); *H10B 12/488* (2023.02); *H10W 20/033* (2026.01)

(58) Field of Classification Search
CPC .... H10B 12/033; H10B 12/03; H10B 12/482; H10B 12/488; H10B 12/05; H10B 12/02; H10B 12/315; H10B 12/30
See application file for complete search history.

(56) References Cited

U.S. PATENT DOCUMENTS

| | | | | |
|---|---|---|---|---|
| 12,550,317 | B2 * | 2/2026 | Kang | H10B 12/488 |
| 2020/0020715 | A1 * | 1/2020 | Nakamura | H10D 64/037 |
| 2020/0365604 | A1 * | 11/2020 | Lai | H10B 43/40 |
| 2022/0005810 | A1 | 1/2022 | Kang et al. | |
| 2022/0068933 | A1 * | 3/2022 | Smythe Iii | G11C 29/816 |
| 2022/0102358 | A1 | 3/2022 | Park et al. | |
| 2022/0271040 | A1 | 8/2022 | Kim | |
| 2022/0285353 | A1 * | 9/2022 | Cho | H10B 12/05 |
| 2022/0285362 | A1 * | 9/2022 | Fishburn | H10B 12/03 |
| 2023/0044391 | A1 * | 2/2023 | Breil | H10B 12/03 |
| 2023/0125896 | A1 * | 4/2023 | Kim | H10B 12/30 257/296 |
| 2023/0255015 | A1 * | 8/2023 | Shin | H10B 12/05 257/296 |
| 2023/0320067 | A1 * | 10/2023 | Kim | H10B 12/05 438/239 |
| 2023/0343823 | A1 * | 10/2023 | Baek | H10D 30/43 |
| 2024/0098969 | A1 * | 3/2024 | Hwang | H10B 12/05 |

* cited by examiner

*Primary Examiner* — Bac H Au
(74) *Attorney, Agent, or Firm* — IP & T GROUP LLP

(57) ABSTRACT

A method for fabricating a semiconductor device includes forming a stack body by sequentially forming a first layer, a second layer, a third layer, a fourth layer, and a fifth layer over a lower structure; forming an opening in the stack body; forming a capping layer that exposes an edge of the third layer by horizontally recessing the second layer and the fourth layer from the opening; forming a liner structure on the capping layer and an edge of the third layer; forming a sacrificial liner material over the liner structure; recessing the sacrificial liner material and the liner structure to expose an edge of the third layer; forming a third layer pattern by recessing an exposed edge of the third layer; and forming a data storage element that is coupled to the third layer pattern.

20 Claims, 14 Drawing Sheets

SEMICONDUCTOR DEVICE AND METHOD FOR FABRICATING THE SAME

CROSS-REFERENCE TO RELATED APPLICATIONS

The present application claims priority under 35 U.S.C 119(a) to Korean Patent Application No. 10-2023-0106199, filed on Aug. 14, 2023, which is incorporated herein by reference in its entirety.

BACKGROUND

1. Field

Various embodiments of the present invention relate to a semiconductor device, and more particularly, to a semiconductor device including three-dimensional memory cells, and a method for fabricating the semiconductor device.

2. Description of the Related Art

Recently, in order to cope with the demands for large capacity and miniaturization of memory devices, a technology for providing a 3D memory device in which a plurality of memory cells are stacked has been advanced.

SUMMARY

Embodiments of the present invention are directed to a semiconductor device including highly integrated memory cells, and a method for fabricating the semiconductor device.

In accordance with one embodiment of the present invention, a method for fabricating a semiconductor device includes: forming a stack body by sequentially forming a first layer, a second layer, a third layer, a fourth layer, and a fifth layer over a lower structure; forming an opening in the stack body; forming a capping layer that exposes an edge of the third layer by horizontally recessing the second layer and the fourth layer from the opening; forming a liner structure on the capping layer and an edge of the third layer; forming a sacrificial liner material over the liner structure; recessing the sacrificial liner material and the liner structure to expose an edge of the third layer; forming a third layer pattern by recessing an exposed edge of the third layer; and forming a data storage element that is coupled to the third layer pattern.

In accordance with another embodiment of the present invention, a method for fabricating a semiconductor device includes: forming a stack body by sequentially forming a first layer, a second layer, a third layer, a fourth layer, and a fifth layer over a lower structure; forming a first opening in the stack body; through the first opening, replacing a portion of the second layer and a portion of the fourth layer with horizontal conductive lines; forming a vertical conductive line that is coupled to a first edge of the third layer while filling the first opening; forming a second opening in the stack body; forming a capping layer that exposes a second edge of the third layer by horizontally recessing the second layer and the fourth layer from the second opening; forming a liner structure over the capping layer and the second edge of the third layer; forming a sacrificial liner material over the liner structure; recessing the sacrificial liner material and the liner structure to expose the second edge of the third layer; forming a third layer pattern by recessing the exposed second edge of the third layer; and forming a data storage element that is coupled to the third layer pattern.

In accordance with another embodiment of the present invention, a semiconductor device includes: cell isolation layers vertically oriented in a first direction; horizontal layers oriented horizontally in a second direction crossing the first direction and vertically stacked in the first direction between the cell isolation layers; a vertical conductive line oriented vertically in the first direction and coupled to first edges of the horizontal layers; horizontal conductive lines crossing each of the horizontal layers in a third direction crossing the first direction and the second direction; and data storage elements respectively coupled to the second edges of the horizontal layers. The semiconductor device may further include capping layers between data storage elements and horizontal conductive lines; and liner layers between the capping layers and the data storage elements. The liner layers may include: a first liner layer disposed on upper and lower surfaces of the second edges of the horizontal layers, a second liner layer disposed between the capping layers and the data storage elements over the first liner layer, and a third liner layer disposed inside the second liner layer. Each of the data storage elements may include first electrodes stacked in the first direction, a dielectric layer over the first electrodes, and a second electrode over the dielectric layer.

DETAILED DESCRIPTION

Figure 1A:
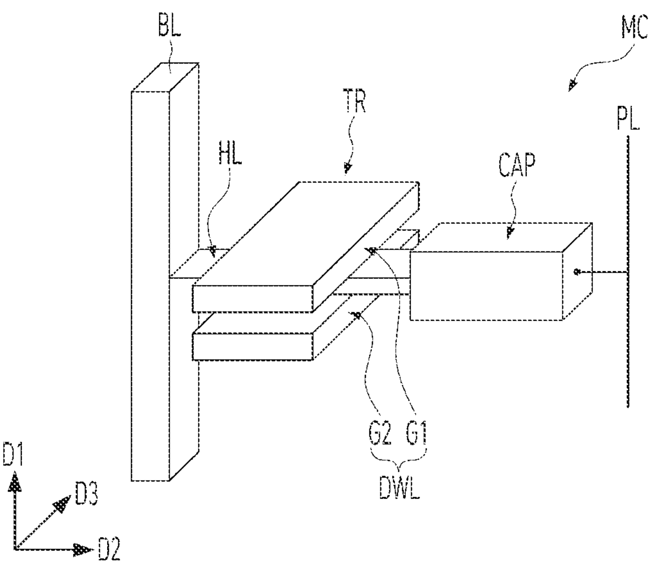
FIG. 1A is a schematic perspective view illustrating a memory cell in accordance with one embodiment of the present invention.

Various embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough and complete, and will convey the scope of the present invention to those skilled in the art. Throughout the disclosure, like reference numerals refer to like parts throughout the various figures and embodiments of the present invention.

The drawings are not necessarily to scale and in some instances, proportions may have been exaggerated to clearly illustrate features of the embodiments. When a first layer is referred to as being "on" a second layer or "on" a substrate, it not only refers to a case where the first layer is formed directly on the second layer or the substrate but also a case where a third layer exists between the first layer and the second layer or the substrate.

The following embodiments of the present invention relate to three-dimensional memory cells, and memory cells may be vertically stacked to increase memory cell density and reduce parasitic capacitance.

Figure 1B:
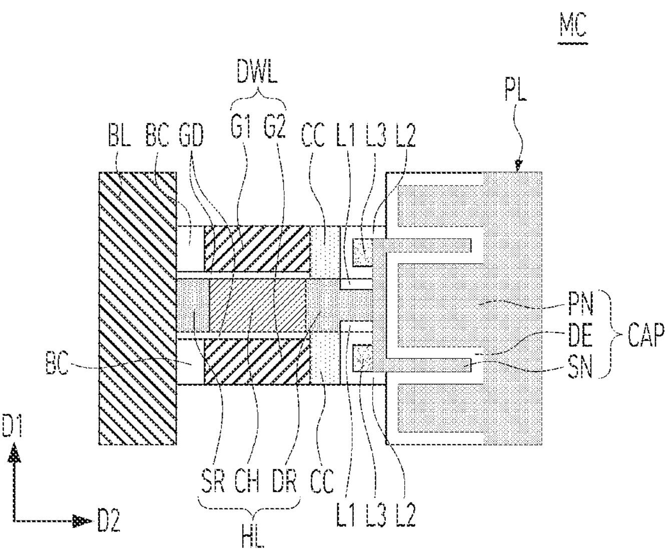
FIG. 1B is a schematic cross-sectional view illustrating the memory cell shown in FIG. 1A.

FIG. 1A is a schematic perspective view illustrating a memory cell in accordance with another embodiment of the present invention. FIG. 1B is a schematic cross-sectional view illustrating the memory cell shown in FIG. 1A.

Referring to FIGS. 1A and 1B, a memory cell MC may include a first conductive line BL, a switching element TR, and a data storage element CAP.

The first conductive line BL may be vertically oriented in a first direction D1. The first conductive line BL may include a bit line. The first conductive line BL may be referred to as a vertical conductive line, a vertically-oriented bit line, a vertically-extending bit line, or a pillar-shaped bit line. The first conductive line BL may include a conductive material. The first conductive line BL may include a silicon-based material, a metal-based material, or a combination thereof. The first conductive line BL may include polysilicon, a metal, a metal nitride, a metal silicide, or a combination thereof. The first conductive line BL may include polysilicon, titanium nitride, tungsten, or a combination thereof. For example, the first conductive line BL may include a stack of titanium nitride and tungsten (TiN/W).

The switching element TR may have a function of controlling voltage (or current) supply to the data storage element CAP in a data write operation and a data read operation of the data storage element CAP. The switching element TR may include a horizontal layer HL, an inter-level dielectric layer GD, and a second conductive line DWL. The second conductive line DWL may include a horizontal conductive line or a horizontal word line, and the horizontal layer HL may include an active layer. The switching element TR may include a transistor, and in this case, the second conductive line DWL may serve as a gate electrode. The switching element TR may also be referred to as an access element or a selection element. The second conductive line DWL may be referred to as a horizontal gate electrode or a horizontal word line.

The horizontal layer HL may extend in a second direction D2 crossing the first direction D1. The second conductive line DWL may extend in a third direction D3 crossing the first and second directions D1 and D2. The first direction D1 may be a vertical direction, the second direction D2 may be a first horizontal direction, and the third direction D3 may be a second horizontal direction. The horizontal layer HL may extend in a first horizontal direction (i.e., the second direction D2), and the second conductive line DWL may extend in the second horizontal direction (i.e., the third direction D3).

The horizontal layer HL may include a semiconductor material. For example, the horizontal layer HL may include one or more of polysilicon, monocrystalline silicon, germanium, or silicon-germanium or a combination thereof. According to another embodiment of the present invention, the horizontal layer HL may include an oxide semiconductor material. For example, the oxide semiconductor material may include indium gallium zinc oxide (IGZO). According to another embodiment of the present invention, the horizontal layer HL may include a conductive metal oxide.

The upper and lower surfaces of the horizontal layer HL may have flat surfaces. In other words, the upper and lower surfaces of the horizontal layer HL may be parallel to each other in the second direction D2.

The horizontal layer HL may include a channel CH, a first doped region SR between the channel CH and the first conductive line BL, and a second doped region DR between the channel CH and the data storage element CAP. When the horizontal layer HL is formed of an oxide semiconductor material, the channel CH may be formed of an oxide semiconductor material, and the first and second doped regions SR and DR may be omitted. The horizontal layer HL may also be referred to as an active layer or a thin-body.

The first doped region SR and the second doped region DR may be doped with impurities of the same conductivity type. The first doped region SR and the second doped region DR may be doped with an N-type impurity or a P-type impurity. The first doped region SR and the second doped region DR may include at least one impurity selected among arsenic (As), phosphorus (P), boron (B), indium (In), and combinations thereof. The first doped region SR may be coupled to the first conductive line BL, and the second doped region DR may be coupled to the data storage element CAP. The first and second doped regions SR and DR may be referred to as first and second source/drain regions.

The horizontal layer HL may be horizontally oriented in the second direction D2 from the first conductive line BL.

The second conductive line DWL may have a double structure. For example, the second conductive line DWL may include an upper horizontal line G1 and a lower horizontal line G2 that are facing each other with the horizontal layer HL therebetween. An inter-level dielectric layer GD may be formed on the upper and lower surfaces of the horizontal layer HL. The upper horizontal line G1 may be disposed over the horizontal layer HL, and a lower horizontal line G2 may be disposed below the horizontal layer HL. The second conductive line DWL may include a pair of an upper horizontal line G1 and a lower horizontal line G2. In the second conductive line DWL, the same driving voltage may be applied to the upper horizontal line G1 and the lower horizontal line G2. For example, the upper horizontal line G1 and the lower horizontal line G2 may form a pair and may be coupled to one memory cell MC. According to another embodiment of the present invention, different driving voltages may be applied to the upper horizontal line G1 and the lower horizontal line G2. In this case, one of the upper horizontal line G1 and the lower horizontal line G2 may serve as a back gate or a shield gate.

The second conductive line DWL may include a metal-based material, a semiconductor material, or a combination thereof. The second conductive line DWL may include titanium nitride, tungsten, polysilicon, or a combination thereof. For example, the second conductive line DWL may include a TiN/W stack in which titanium nitride and tungsten are sequentially stacked. The second conductive line DWL may include an N-type work function material or a P-type work function material. The N-type work function material may have a low work function of for example approximately 4.5 eV or less, and the P-type work function material may have a high work function of for example approximately 4.5 eV or more. The second conductive line DWL may include a stack of a low work function material and a high work function material.

The inter-level dielectric layer GD may be disposed between the horizontal layer HL and the second conductive line DWL. The inter-level dielectric layer GD may be referred to as a gate dielectric layer. The inter-level dielectric layer GD may be referred to as a horizontal layer-side dielectric layer. The inter-level dielectric layer GD may include one or more of silicon oxide, silicon nitride, a metal oxide, a metal oxynitride, a metal silicate, a high-k material, a ferroelectric material, an anti-ferroelectric material or a combination thereof. The inter-level dielectric layer GD may include one or more of $SiO_2$, $Si_3N_4$, $HfO_2$, $Al_2O_3$, $ZrO_2$, AlON, HfON, HfSiO, HfSiON, HfZrO, or a combination thereof. The inter-level dielectric layer GD may be formed by thermal oxidation of a semiconductor material.

The data storage element CAP may include a memory element, such as a capacitor. The data storage element CAP may be horizontally disposed in the second direction D2 from the switching element TR. The data storage element CAP may include a first electrode SN extending horizontally from the horizontal layer HL in the second direction D2. The data storage element CAP may further include a second electrode PN over the first electrode SN, and a dielectric layer DE between the first electrode SN and the second electrode PN. The first electrode SN, the dielectric layer DE, and the second electrode PN may be horizontally arranged in the second direction D2. The first electrode SN may include an inner space and a plurality of outer surfaces, and the inner space of the first electrode SN may include a plurality of inner surfaces. The outer surfaces of the first electrode SN may include a vertical outer surface and a plurality of horizontal outer surfaces. The vertical outer surface of the first electrode SN may extend vertically in the first direction D1, and the horizontal outer surface of the first electrode SN may extend horizontally in the second or third direction D2 or D3. The inner space of the first electrode SN may be a three-dimensional space. The dielectric layer DE may conformally cover the inner and outer surfaces of the first electrode SN. The second electrode PN may be disposed in the inner space of the first electrode SN over the dielectric layer DE. Some of the outer surfaces of the first electrode SN may be electrically connected to the second doped region DR of the horizontal layer HL. The second electrode PN of the data storage element CAP may be coupled to a common plate PL.

The data storage element CAP may have a three-dimensional structure. The first electrode SN may have a 3D structure, and the first electrode SN of the 3D structure may have a horizontal 3D structure which is oriented in the second direction D2. As an example of the 3D structure, the first electrode SN may have a cylindrical shape. The cylindrical shape of the first electrode SN may include cylindrical inner surfaces and cylindrical outer surfaces. Some of the cylindrical outer surfaces of the first electrode SN may be electrically connected to the second doped region DR of the horizontal layer HL. The dielectric layer DE and the second electrode PN may be disposed on the cylindrical inner surfaces of the first electrode SN.

According to another embodiment of the present invention, the first electrode SN may have a pillar shape or a pylinder shape. The pylinder shape refers to a structure in which a pillar shape and a cylindrical shape are merged.

The first electrode SN and the second electrode PN may include one or more of a metal, a noble metal, a metal nitride, a conductive metal oxide, a conductive noble metal oxide, a metal carbide, a metal silicide, or a combination thereof. For example, the first electrode SN and the second electrode PN may one or more of include titanium (Ti), titanium nitride (TiN), tantalum (Ta), tantalum nitride (TaN), tungsten (W), tungsten nitride (WN), ruthenium (Ru), ruthenium oxide ($RuO_2$), iridium (Ir), iridium oxide ($IrO_2$), platinum (Pt), molybdenum (Mo), molybdenum oxide (MoO), a titanium nitride/tungsten (TiN/W) stack, a tungsten nitride/tungsten (WN/W) stack, or a combination thereof. The second electrode PN may include a combination of a metal-based material and a silicon-based material. For example, the second electrode PN may be a stack of titanium nitride/silicon germanium/tungsten nitride (TiN/SiGe/WN). In the titanium nitride/silicon germanium/tungsten nitride (TiN/SiGe/WN) stack, silicon germanium may be a gap-fill material filling the inside of the first electrode SN, and titanium nitride (TiN) may serve as the second electrode PN of a data storage element CAP, and tungsten nitride may be a low-resistance material.

The dielectric layer DE may be referred to as a capacitor dielectric layer or a memory layer. The dielectric layer DE may include one or more of silicon oxide, silicon nitride, a high-k material, or a combination thereof. The high-k material may include one or more of hafnium oxide ($HfO_2$), zirconium oxide ($ZrO_2$), aluminum oxide ($Al_2O_3$), lanthanum oxide ($La_2O_3$), titanium oxide ($TiO_2$), tantalum oxide ($Ta_2O_5$), niobium oxide ($Nb_2O_5$) or strontium titanium oxide ($SrTiO_3$) or a combination thereof. According to another embodiment of the present invention, the dielectric layer DE may be formed of a composite layer including two or more layers of the aforementioned high-k materials.

The dielectric layer DE may be formed of zirconium (Zr)-based oxide. The dielectric layer DE may have a stack structure including zirconium oxide ($ZrO_2$). The dielectric layer DE may include a ZA ($ZrO_2/Al_2O_3$) stack or a ZAZ ($ZrO_2/Al_2O_3/ZrO_2$) stack. The ZA stack may have a structure in which aluminum oxide ($Al_2O_3$) is stacked over zirconium oxide ($ZrO_2$). The ZAZ stack may have a structure in which zirconium oxide ($ZrO_2$), aluminum oxide ($Al_2O_3$), and zirconium oxide ($ZrO_2$) are sequentially stacked. The ZA stack and the ZAZ stack may be referred to as a zirconium oxide ($ZrO_2$)-based layer.

According to another embodiment of the present invention, the dielectric layer DE may be formed of hafnium (Hf)-based oxide. The dielectric layer DE may have a stack structure including hafnium oxide ($HfO_2$). The dielectric layer DE may include an HA ($HfO_2/Al_2O_3$) stack or an HAH ($HfO_2/Al_2O_3/HfO_2$) stack. The HA stack may have a structure in which aluminum oxide ($Al_2O_3$) is stacked over hafnium oxide ($HfO_2$). The HAH stack may have a structure in which hafnium oxide ($HfO_2$), aluminum oxide ($Al_2O_3$), and hafnium oxide ($HfO_2$) are sequentially stacked. The HA stack and the HAH stack may be referred to as a hafnium oxide ($HfO_2$)-based layer. In the ZA stack, ZAZ stack, HA stack, and HAH stack, aluminum oxide ($Al_2O_3$) may have a greater bandgap energy than zirconium oxide ($ZrO_2$) and hafnium oxide ($HfO_2$). Aluminum oxide ($Al_2O_3$) may have a lower dielectric constant than zirconium oxide ($ZrO_2$) and hafnium oxide ($HfO_2$). Accordingly, the dielectric layer DE may include a stack of a high-k material and a high-bandgap material having a greater bandgap energy than the high-k material. The dielectric layer DE may include silicon oxide ($SiO_2$) as a high bandgap material other than aluminum oxide ($Al_2O_3$). Since the dielectric layer DE includes a high bandgap material, leakage current may be suppressed. The high-bandgap material may be thinner than the high-k material. According to another embodiment of the present invention, the dielectric layer DE may include a stacked structure in which a high-k material and a high-bandgap material are alternately stacked. For example, the dielectric layer DE may include a ZAZA ($ZrO_2/Al_2O_3/ZrO_2/Al_2O_3$) stack, a ZAZAZ ($ZrO_2/Al_2O_3/ZrO_2/Al_2O_3/ZrO_2$) stack, a HAHA ($HfO_2/Al_2O_3/HfO_2/Al_2O_3$) stack, or a HAHAH ($HfO_2/Al_2O_3/HfO_2/Al_2O_3/HfO_2$) stack. In the above stacked structure, aluminum oxide ($Al_2O_3$) may be thinner than zirconium oxide ($ZrO_2$) and hafnium oxide ($HfO_2$).

According to another embodiment of the present invention, the dielectric layer DE may include a high-k material and a high-bandgap material, and may include a laminated structure in which a plurality of high-k materials and a plurality of high-bandgap materials are stacked, or a mixed structure in which a high-k material and a high-bandgap material are inter-mixed with each other.

According to another embodiment of the present invention, the dielectric layer DE may include a ferroelectric material, an anti-ferroelectric material, or a combination thereof. For example, the dielectric layer DE may include hafnium zirconium oxide (HfZrO).

According to another embodiment of the present invention, the dielectric layer DE may include a combination of a high-k material and a ferroelectric material, a combination of a high-k material and an anti-ferroelectric material, a high-k material, or a combination of a ferroelectric material and an anti-ferroelectric material.

According to another embodiment of the present invention, an interface control layer for improving leakage current may be further formed between the first electrode SN and the dielectric layer DE. The interface control layer may include one or more of titanium oxide ($TiO_2$), tantalum oxide ($Ta_2O_5$), niobium oxide ($Nb_2O_5$), niobium nitride (NbN), or a combination thereof. The interface control layer may also be formed between the second electrode PN and the dielectric layer DE.

The data storage element CAP may include a three-dimensional capacitor. The data storage element CAP may include a Metal-Insulator-Metal (MIM) capacitor. The data storage element CAP may be replaced with other data storage materials. For example, the data storage material may be a thyristor, a phase change material, a magnetic tunnel junction (MTJ), or a variable resistance material.

For example, the memory cell MC may include a thyristor, the first conductive line BL may be a cathode line, and the data storage element CAP may be replaced with an anode line. Accordingly, the horizontal layer HL may include four semiconductor layers that are horizontally stacked in the second direction D2. The thyristor may include a first diode and a second diode that are coupled serially. When a forward bias of the same voltage is applied to the thyristor, the thyristor may have a high conductance state in which a relatively large amount of current flows or a low conductance state in which a relatively small amount of or no current flows. Each memory cell MC may have a '1' state or a '0' state based on the high conductance state and the low conductance state of the thyristor, respectively.

Referring back to FIG. 1B, the first capping layer BC may be disposed between the first conductive line BL and the second conductive line DWL. A second capping layer CC may be disposed between the second conductive line DWL and the first electrode SN of the data storage element. The first capping layer BC may be disposed between the upper horizontal line G1 and the first conductive line BL, and the first capping layer BC may be disposed between the lower horizontal line G2 and the first conductive line BL. The second capping layer CC may be disposed between the upper horizontal line G1 and the first electrode SN of the data storage element CAP, and the second capping layer CC may be disposed between the lower horizontal line G2 and the first electrode SN of the data storage element CAP.

The first and second capping layers BC and CC may include a dielectric material. The first and second capping layers BC and CC may include one or more of silicon oxide, silicon nitride, silicon carbon oxide, an air gap, or a combination thereof. The first capping layer BC may include silicon oxide, and the second capping layer CC may include a stack of silicon oxide and silicon nitride.

A plurality of liner layers L1, L2, and L3 may be disposed between the first electrode SN of the data storage element and the second capping layer CC. The liner layers L1, L2, and L3 may include a first liner layer L1, a second liner layer L2, and a third liner layer L3. The first liner layers L1 may be disposed on the upper and lower surfaces of the edges of the horizontal layer HL. The second liner layers L2 may contact the second capping layers CC, and the third liner layers L3 may be disposed in the second liner layers L2. The first liner layers L1 and the second liner layers L2 may include silicon oxide, and the third liner layers L3 may include silicon nitride.

Figure 2:
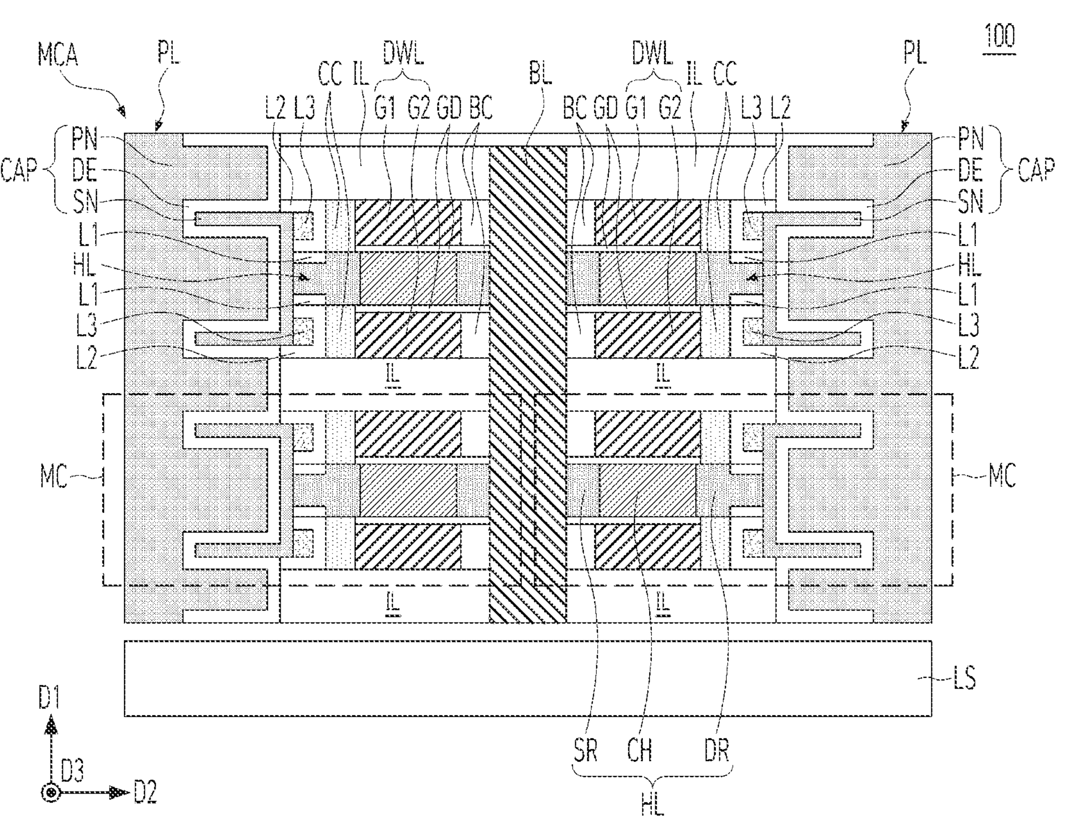
FIG. 2 is a schematic cross-sectional view illustrating a semiconductor device in accordance with another embodiment of the present invention.

FIG. 2 is a schematic cross-sectional view illustrating a semiconductor device in accordance with another embodiment of the present invention.

Referring to FIG. 2, the semiconductor device 100 may include a memory cell array MCA. The memory cell array MCA may include a plurality of memory cells MC. Each of the memory cells MC will be referred to with the same terminology as used in FIGS. 1A and 1B. Each memory cell MC may include a first conductive line BL, a switching element TR, and a data storage element CAP.

Hereinafter, the semiconductor device 100 will be described with reference to FIGS. 1A, 1B, and 2.

The memory cell array MCA may include a three-dimensional array of memory cells MC. The 3D array of memory cells MC may include a column array of memory cells MC and a row array of memory cells MC. The column array of memory cells MC may include a plurality of memory cells MC that are stacked in the first direction D1, and the row array of memory cells MC may include a plurality of memory cells MC that are horizontally disposed in the second direction D2. The memory cell array MCA may have a mirror-type structure in which two memory cells MC share a first conductive line BL. According to another embodiment of the present invention, the semiconductor device 100 may further include mirror-type memory cell arrays in which two memory cells MC share a second electrode PN of the data storage element CAP.

Inter-cell dielectric layers IL may be disposed between the memory cells MC that are stacked in the first direction D1. The inter-cell dielectric layers IL may include silicon oxide. The inter-cell dielectric layers IL may be referred to as horizontal inter-cell dielectric layers.

The memory cell array MCA may be disposed over the lower structure LS.

The memory cell array MCA may include a plurality of second conductive lines DWL that are vertically stacked in the first direction D1. The memory cell array MCA may include a plurality of horizontal layers HL that are vertically stacked in the first direction D1. The memory cell array MCA may include a plurality of data storage elements CAP that are vertically stacked in the first direction D1. The memory cell array MCA may include a plurality of first conductive lines BL that are spaced apart from each other in the third direction D3.

The first conductive lines BL may extend vertically from the upper portion of the lower structure LS in the first direction D1. The horizontal layers HL may extend in the second direction D2 crossing the first direction D1. The second conductive lines DWL may extend in a third direction D3 crossing the first and second directions D1 and D2.

First capping layers BC may be disposed between the second conductive line DWL and the first conductive line BL. Second capping layers CC may be disposed between the second conductive line DWL and the first electrode SN of the data storage element. The first capping layers BC may be disposed between the upper horizontal line G1 and the first conductive line BL, and the first capping layer BC may be disposed between the lower horizontal line G2 and the first conductive line BL. The second capping layer CC may be disposed between the upper horizontal line G1 and the first electrode SN of the data storage element CAP, and the second capping layer CC may be disposed between the lower horizontal line G2 and the first electrode SN of the data storage element CAP. One memory cell MC may include a pair of first capping layers BC and a pair of second capping layers CC.

The first and second capping layers BC and CC may include a dielectric material. The first and second capping layers BC and CC may include one or more of silicon oxide, silicon nitride, silicon carbon oxide, an air gap, or a combination thereof. The first capping layer BC may include silicon oxide, and the second capping layer CC may include a stack of silicon oxide and silicon nitride. According to another embodiment of the present invention, the first capping layer BC may include a stack of silicon oxide and silicon nitride.

A plurality of liner layers L1, L2, and L3 may be disposed between the first electrode SN of the data storage element and the second capping layer CC. The liner layers L1, L2, and L3 may include a first liner layer L1, a second liner layer L2, and a third liner layer L3. The first liner layers L1 may be disposed on the surfaces of the edges (i.e., the upper and lower surfaces) of the horizontal layer HL. The second liner layers L2 may contact the second capping layers CC, and the third liner layers L3 may be disposed in the second liner layers L2. The first liner layers L1 and the second liner layers L2 may include silicon oxide, and the third liner layers L3 may include silicon nitride.

The horizontal layers HL of the switching elements TR disposed horizontally in the third direction D3 may share one second conductive line DWL. The horizontal layers HL of the switching elements TR disposed horizontally in the third direction D3 may be coupled to different first conductive lines BL. The switching elements TR stacked in the first direction D1 may share one first conductive line BL. The switching elements TR disposed horizontally in the third direction D3 may share one second conductive line DWL.

The second electrodes PN of the data storage elements CAP may be coupled to a common plate PL.

The lower structure LS may include a semiconductor substrate, a metal interconnection structure, a dielectric structure, a conductive structure, a bonding pad structure, another memory or a peripheral circuit unit.

For example, the lower structure LS may include a structure in which a peripheral circuit unit, a metal interconnection structure, and a bonding pad structure are sequentially stacked. The memory cell array MCA and the peripheral circuit unit of the lower structure LS may be coupled by wafer bonding.

The peripheral circuit unit of the lower structure LS may be disposed at a lower level than the memory cell array MCA. This may be referred to as a Cell-Over-Peripheral (COP) structure. The peripheral circuit unit may include at least one control circuit for driving the memory cell array MCA. The at least one control circuit of the peripheral circuit unit may include an N-channel transistor, a P-channel transistor, a CMOS circuit, or a combination thereof. The at least one control circuit of the peripheral circuit unit may include an address decoder circuit, a read circuit, a write circuit, and the like. The at least one control circuit of the peripheral circuit unit may include a planar channel transistor, a recess channel transistor, a buried gate transistor, a fin channel transistor (FinFET), and the like.

For example, the peripheral circuit unit may include sub-word line drivers and a sense amplifier. The second conductive lines DWL may be coupled to the sub-word line drivers. The first conductive line BL may be coupled to the sense amplifier.

According to another embodiment of the present invention, the peripheral circuit unit may be disposed at a higher level than the memory cell array MCA. This may be referred to as a Peripheral-Over-Cell (POC) structure. The lower structure LS may include a first semiconductor substrate, and the peripheral circuit unit may include a second semiconductor substrate.

According to another embodiment of the present invention, the memory cell array MCA may include one or more of a Dynamic Random Access Memory (DRAM), an embedded DRAM, a NAND memory, a ferroelectric RAM (FeRAM), a Spin-Transfer Torque RAM (STTRAM), a Phase-Change RAM (PCRAM), or a Resistive RAM (ReRAM).

FIGS. 3 to 18 illustrate an example of a method for fabricating a semiconductor device in accordance with various embodiments of the present invention.

Figure 3:
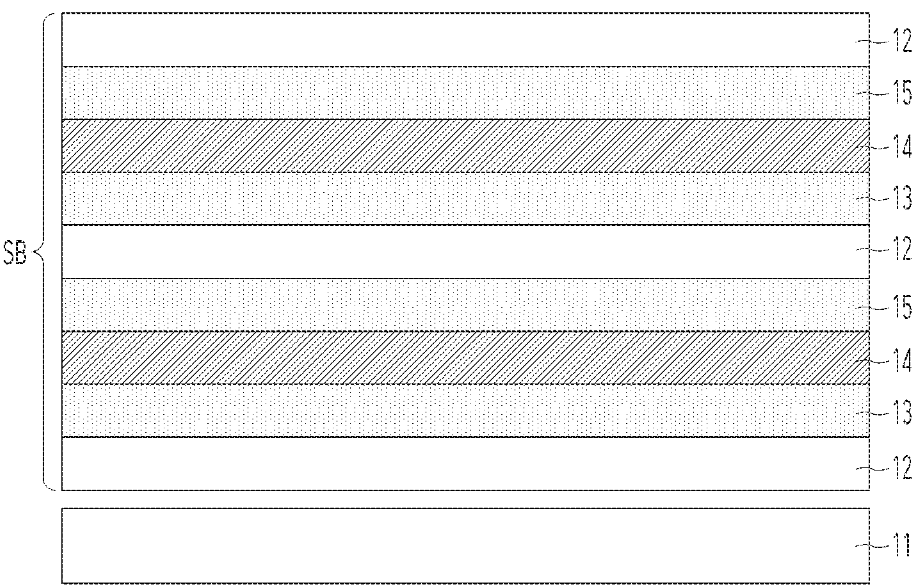
FIGS. 3 to 18 illustrate an example of a method for fabricating a semiconductor device in accordance with another embodiment of the present invention.

Referring to FIG. 3, a stack body SB may be formed over the lower structure 11. The lower structure 11 may be a material suitable for semiconductor processing. The lower structure 11 may include at least one of a conductive material, a dielectric material, and a semiconductor material. Diverse materials may be formed over the lower structure 11. The lower structure 11 may include a semiconductor substrate. The lower structure 11 may be formed of a material containing silicon. The lower structure 11 may include one or more of silicon, monocrystalline silicon, polysilicon, amorphous silicon, silicon germanium, monocrystalline silicon germanium, polycrystalline silicon germanium, carbon-doped silicon, a combination thereof, or a multi-layer thereof. The lower structure 11 may also include other semiconductor materials such as germanium. The lower structure 11 may include a III/V-group semiconductor substrate, for example, a compound semiconductor substrate, such as GaAs. The lower structure 11 may include a silicon on insulator (SOI) substrate. According to another embodiment of the present invention, the lower structure 11 may include one or more of a metal interconnection structure, a dielectric structure, a conductive structure, a bonding pad structure, another memory or a peripheral circuit unit.

For example, the lower structure 11 may include a structure in which a peripheral circuit unit, a metal interconnection structure, and a bonding pad structure are sequentially stacked. The peripheral circuit unit may include at least one or more control circuits. The at least one control circuit of the peripheral circuit unit may include an N-channel transistor, a P-channel transistor, a CMOS circuit, or a combination thereof. The at least one control circuit of the peripheral circuit unit may include an address decoder circuit, a read circuit, a write circuit, and the like. The at least one control circuit of the peripheral circuit unit may include a planar channel transistor, a recess channel transistor, a buried gate transistor, a fin channel transistor (FinFET), and the like. For example, the peripheral circuit unit may include sub-word line drivers and a sense amplifier.

In the stack body SB, a plurality of sub-stacks may be alternately stacked. Forming the individual sub-stack may include sequentially stacking a first layer 12, a second layer 13, a third layer 14, a fourth layer 15, and a fifth layer 12. The third layer 14 may be referred to as a preliminary horizontal layer 14, and the second layer 13 may be simply referred to as a first sacrificial layer 12. The fourth layer 15 may be simply referred to as the second sacrificial layer 15, and the first layer 12 and the fifth layer 12 may be simply referred to as the inter-cell dielectric layers 12 and 15. Accordingly, each sub-stack may include inter-cell dielectric layers 12, first and second sacrificial layers 13 and 15, and a preliminary horizontal layer 14. The preliminary horizontal layer 14 may be disposed between the inter-cell dielectric layers 12, and the first sacrificial layer 13 may be disposed between the lower level inter-cell dielectric layer 12 and the preliminary horizontal layer 14. The second sacrificial layer 15 may be disposed between the upper level inter-cell dielectric layer 12 and the preliminary horizontal layer 14. The inter-cell dielectric layers 12 may include silicon oxide, and the first and second sacrificial layers 13 and 15 may include silicon nitride. The preliminary horizontal layer 14 may include a monocrystalline silicon layer, a polysilicon layer, or an oxide semiconductor layer. Among the inter-cell dielectric layers 12, the lower-level inter-cell dielectric layer 12 may be referred to as a first layer, and the upper-level inter-cell dielectric layer 12 may be referred to as a fifth layer.

Figure 4:
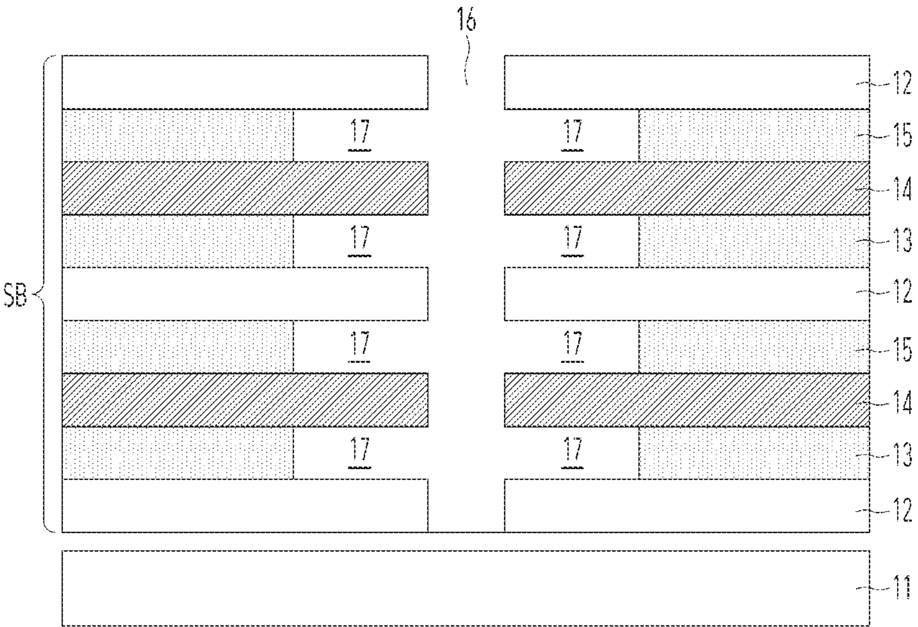

Referring to FIG. 4, a first opening 16 may be formed by etching a portion of the stack body SB.

Subsequently, the first and second sacrificial layers 13 and 15 may be horizontally recessed from the first opening 16. As a result, first sacrificial layer level recesses 17 may be formed. Portions of the preliminary horizontal layers 14 may be exposed by the first sacrificial layer level recesses 17. In order to recess the first and second sacrificial layers 13 and 15, a wet etching process or a dry etching process may be used. The first opening 16 may be a hole-type opening.

Figure 5:
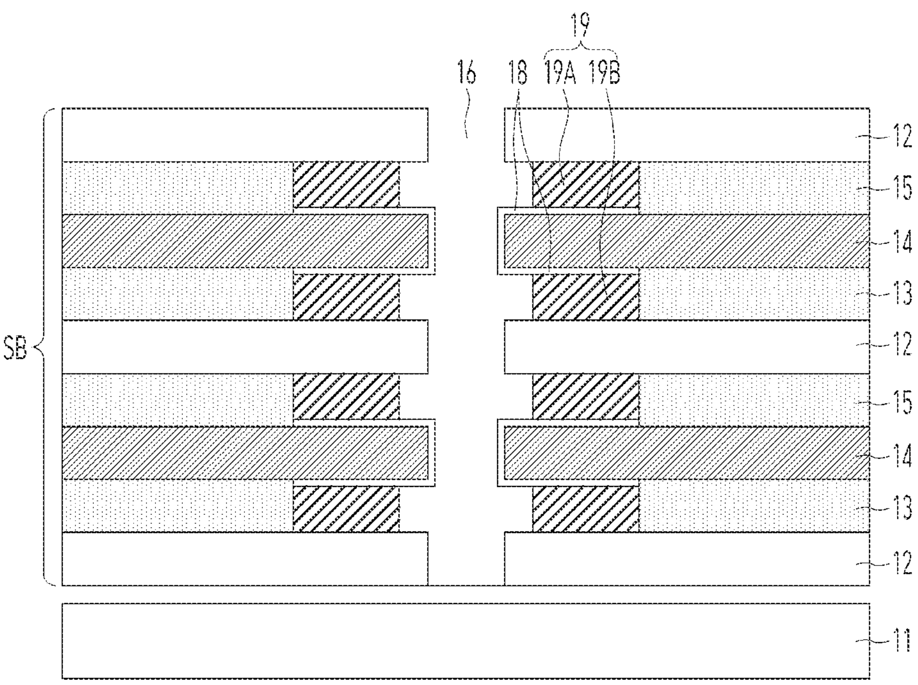

Referring to FIG. 5, an inter-level dielectric layer 18 may be formed over the exposed portions of the preliminary horizontal layers 14. The inter-level dielectric layer 18 may be formed by oxidizing the surfaces of the preliminary horizontal layers 14. According to another embodiment of the present invention, the inter-level dielectric layer 18 may be formed by a deposition process of silicon oxide.

The inter-level dielectric layer 18 may be formed of one or more of silicon oxide, silicon nitride, a metal oxide, a metal oxynitride, a metal silicate, a high-k material, a ferroelectric material, an anti-ferroelectric material, or a combination thereof. The inter-level dielectric layer 18 may include one or more of $SiO_2$, $Si_3N_4$, $HfO_2$, $Al_2O_3$, $ZrO_2$, AlON, HfON, HfSiO, HfSiON, or combinations thereof.

Subsequently, horizontal conductive lines 19 filling the first sacrificial layer level recesses 17 may be formed over the inter-level dielectric layer 18. Forming the horizontal conductive line 19 may include depositing a conductive material that fills the first sacrificial layer level recesses 17 over the inter-level dielectric layer 18 and performing an etch-back process onto the conductive material. The horizontal conductive line 19 may include a pair of first and second horizontal conductive lines 19A and 19B that are facing each other with the preliminary horizontal layer 14 therebetween. The first and second horizontal conductive lines 19A and 19B may include a metal-based material, a semiconductor material, or a combination thereof. The first and second horizontal conductive lines 19A and 19B may include titanium nitride, tungsten, polysilicon, or a combination thereof. For example, the first and second horizontal conductive lines 19A and 19B may include a TiN/W stack in which titanium nitride and tungsten are sequentially stacked. The first and second horizontal conductive lines 19A and 19B may include an N-type work function material or a P-type work function material. The N-type work function material may have a low work function of for example approximately 4.5 eV or less, and the P-type work function material may have a high work function of for example approximately 4.5 eV or more. The horizontal conductive line 19 may correspond to the second conductive line DWL as illustrated in FIGS. 1A, 1B and 2, and the first and second horizontal conductive lines 19A and 19B may correspond to the upper horizontal line G1 and the lower horizontal line G2.

Figure 6:
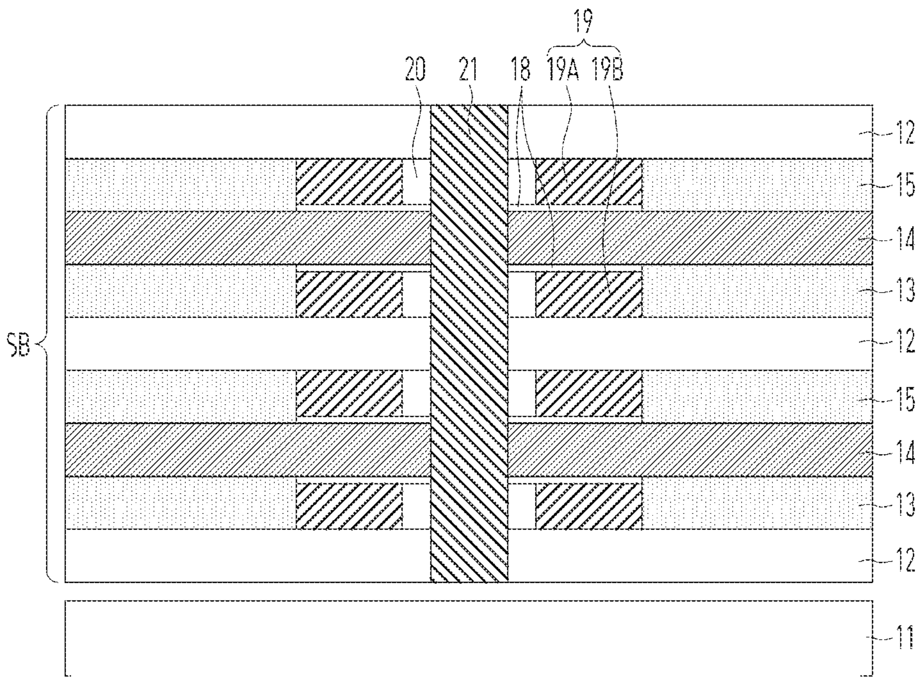

Referring to FIG. 6, a first capping layer 20 may be formed on one side surface of the horizontal conductive line 19. The first capping layer 20 may include silicon oxide, silicon nitride, or a combination thereof. A capping material may be deposited and etched back to form the first capping layer 20. While the first capping layer 20 is formed or after the first capping layer 20 is formed, a portion of the inter-level dielectric layer 18 may be removed to expose a first edge portion of each of the preliminary horizontal layers 14. The first capping layer 20 may correspond to the first capping layer BC as illustrated in FIGS. 1A, 1B and 2.

Subsequently, as shown in FIG. 6, a vertical conductive line 21 coupled to the first edge portion of each of the preliminary horizontal layers 14 may be formed. The vertical conductive line 21 may fill the first opening 16. The vertical conductive line 21 may be commonly coupled to the preliminary horizontal layers 14. The vertical conductive line 21 may include titanium nitride, tungsten, or a combination thereof. The vertical conductive line 21 may include a bit line. The vertical conductive line 21 may correspond to the first conductive line BL as illustrated in FIGS. 1A, 1B and 2.

Figure 7:
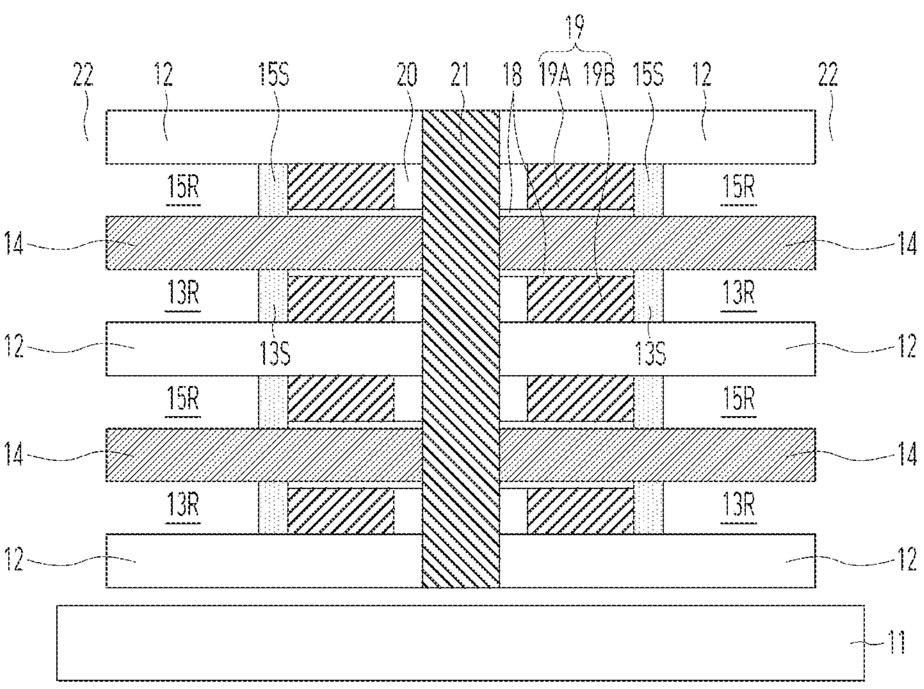

Referring to FIG. 7, the second opening 22 may be formed by etching another portion of the stack body SB. The second opening 22 may be a hole-type opening.

Subsequently, the first and second sacrificial layers 13 and 15 may be horizontally recessed from the second opening 22. As a result, the second sacrificial layer level recesses 13R and 15R may be formed.

After the formation of the second sacrificial layer level recesses 13R and 15R, the remaining first and second sacrificial layers 13 and 15 may become a second capping layer 13S and 15S.

Figure 8:
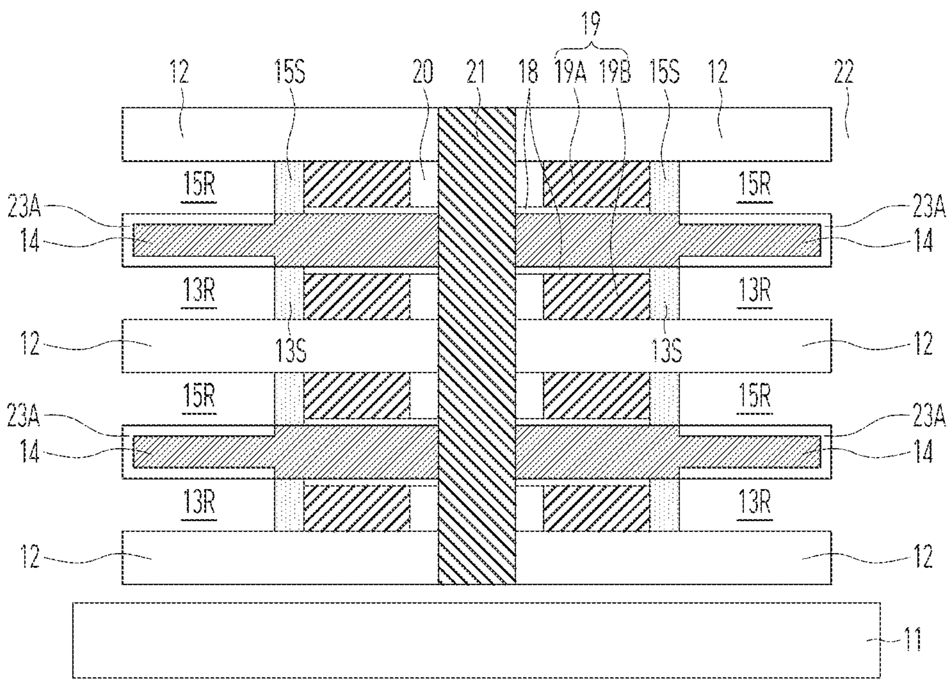

Referring to FIG. 8, a first liner material 23A may be formed on the exposed surfaces of the preliminary horizontal layers 14. The first liner material 23A may be formed by an oxidation process. The vertical thickness of second edge portions of the preliminary horizontal layers 14 may be reduced by the first liner material 23A. The first liner material 23A may include silicon oxide.

Figure 9:
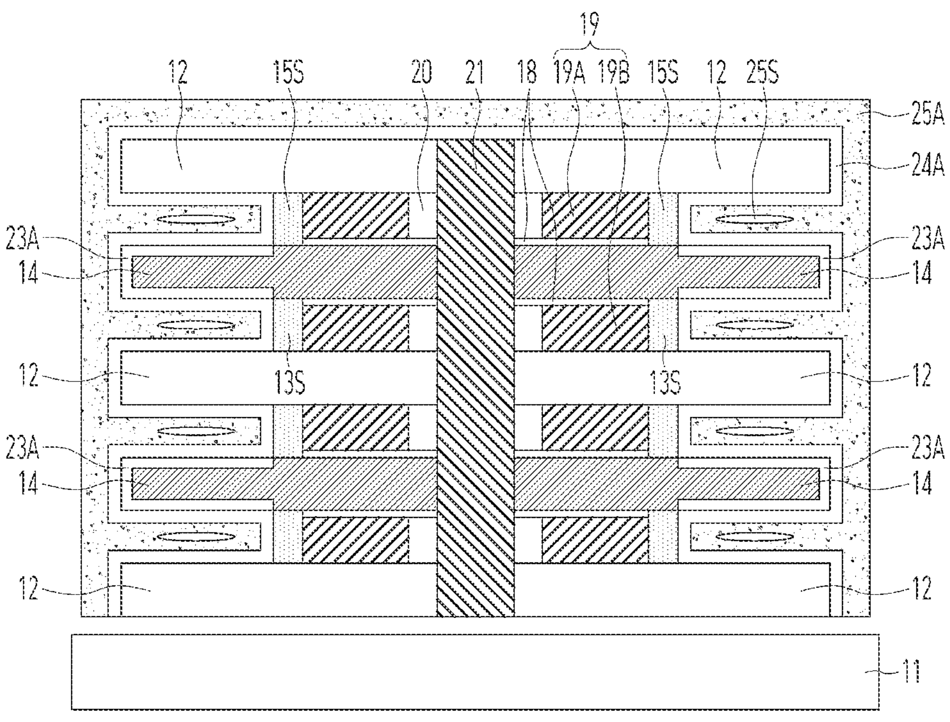

Referring to FIG. 9, a second liner material 24A and a sacrificial liner material 25A may be sequentially formed over the first liner material 23A. The second liner material 24A and the sacrificial liner material 25A may be formed by a deposition process such as chemical vapor deposition (CVD). The second liner material 24A may include silicon oxide, and the sacrificial liner material 25A may include silicon nitride. The sacrificial liner material 25A may include a seam 25S or a void. The first and second liner materials 23A and 24A may be referred to as a liner structure.

Figure 10:
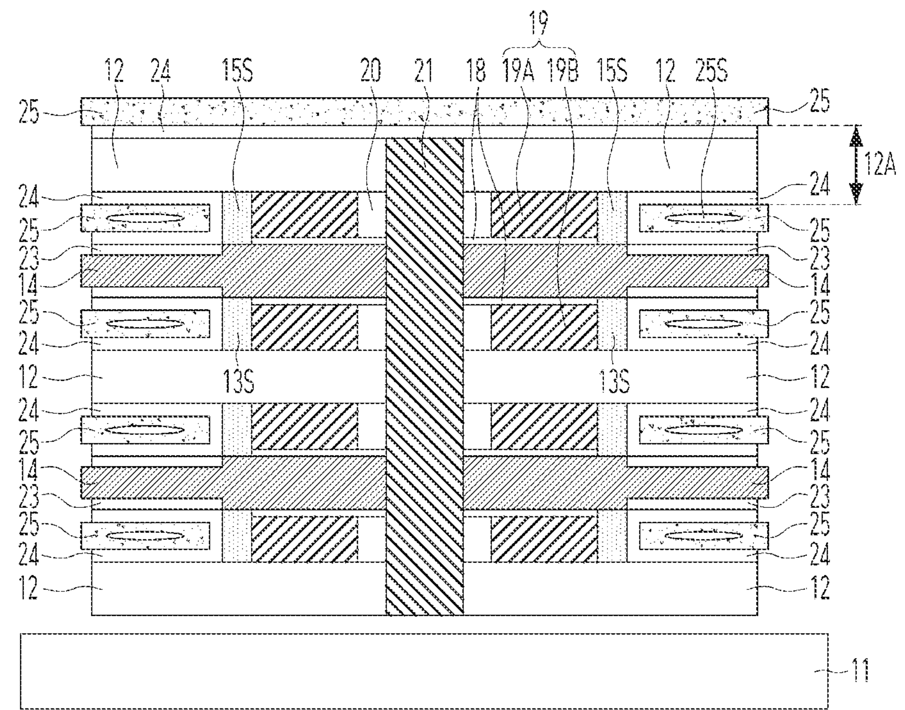

Referring to FIG. 10, the sacrificial liner material 25A may be selectively recessed. Subsequently, the second liner material 24A and the first liner material 23A may be selectively recessed. As a result, the first liner layer 23, the second liner layer 24, and the sacrificial liner layer 25 may be formed. The sacrificial liner layer 25 may include a seam 25S. The seam 25S of the sacrificial liner material 25A may not be exposed to the recess process.

The second edges of the preliminary horizontal layers 14 may be exposed or protrude through the recess processes of the liner materials. The first liner layer 23, the second liner layer 24, and the sacrificial liner layer 25 may be disposed between the inter-cell dielectric layers 12 and the preliminary horizontal layers 14.

The second liner layer 24 may cover the upper and lower surfaces of the inter-cell dielectric layers 12 (refer to a reference numeral '12A'). That is, while the sacrificial liner layer 25 is formed, the upper and lower surfaces of the inter-cell dielectric layers 12 may be prevented from being lost.

Figure 11:
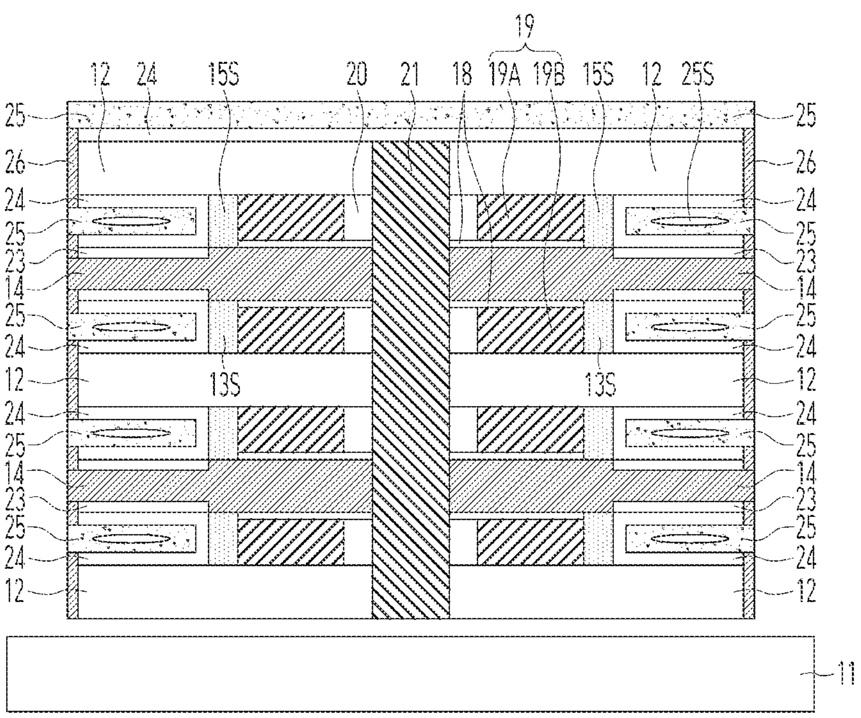

Referring to FIG. 11, a sacrificial covering layer 26 may be formed to cover the upper and lower surfaces of the second edges of the preliminary horizontal layers 14. Forming the sacrificial covering layer 26 may include deposition and etching of silicon nitride. The sacrificial covering layer 26 may cover the first liner layer 23 and the second liner layer 24 and may expose the sacrificial liner layer 25. The sacrificial covering layer 26 may not include a seam. The sacrificial covering layer 26 may be referred to as a pocket layer. The sacrificial covering layer 26 may include a silicon nitride pocket layer.

Figure 12:
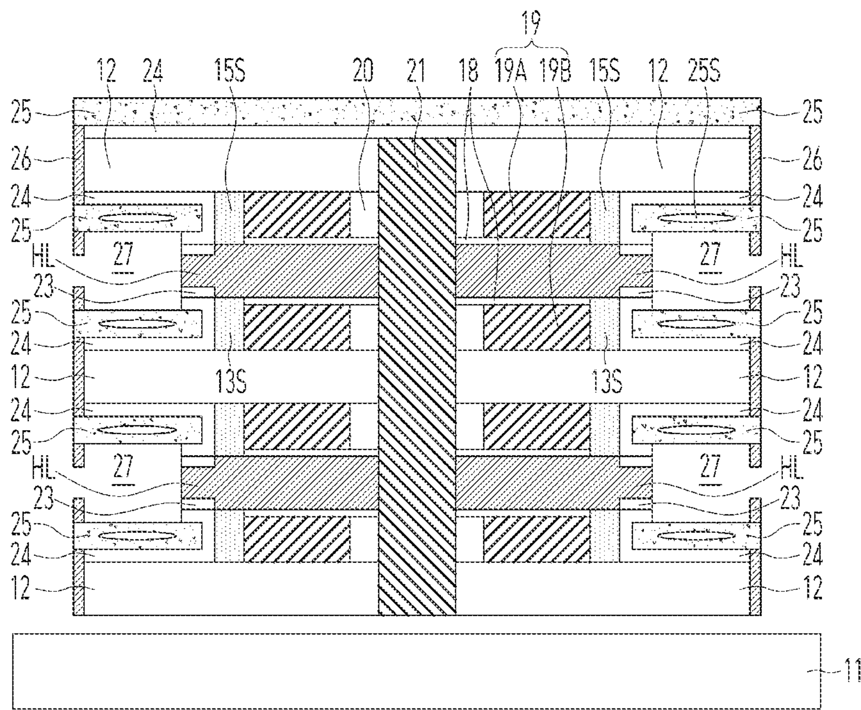

Referring to FIG. 12, the second edges of the preliminary horizontal layers 14 may be selectively horizontally recessed. In the recess process of the preliminary horizontal layers 14, the sacrificial covering layer 26 may be used as an etch barrier. As a result, horizontal layers HL having a short horizontal length may be formed. The horizontal layers HL may be patterns of the third layers 14 (referred to as third layer patterns) which are illustrated in FIG. 3. After the horizontal layers HL are formed, the sacrificial liner layer 25 having the seam 25S may be exposed.

After a recess process for forming the horizontal layer HL is performed, the first and second liner layers 23 and 24 may be partially etched. As a result, preliminary storage openings 27 may be formed. The first liner layer 23 may cover the upper and lower surfaces of the second edges of the horizontal layer HL. The second liner layer 24 may partially cover the sacrificial liner layer 25.

Figure 13:
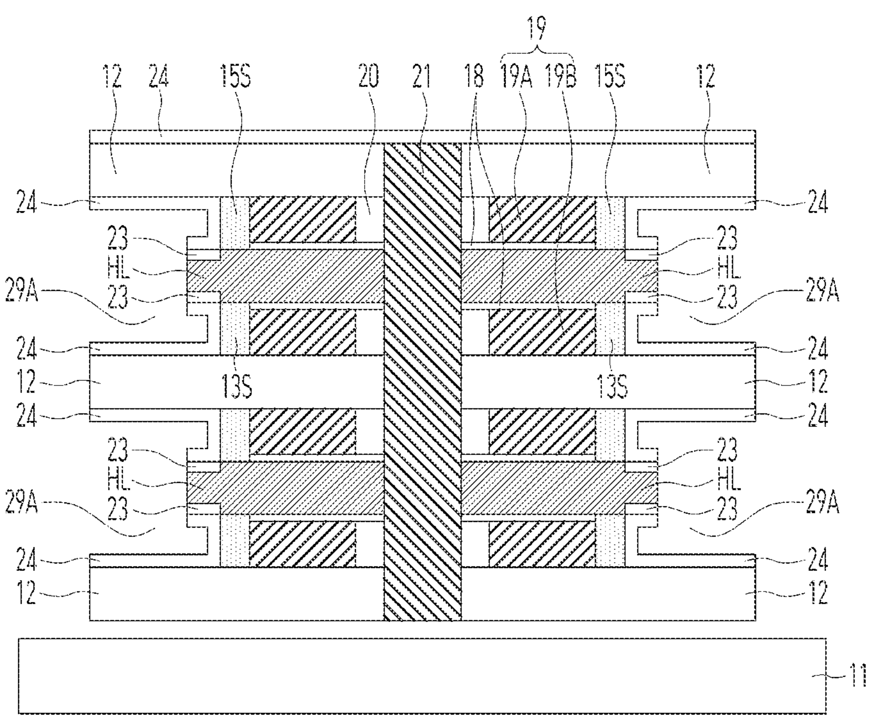

Referring to FIG. 13, the sacrificial covering layer 26 and the sacrificial liner layer 25 may be removed to expose the second liner layer 24. As the sacrificial covering layer 26 and the sacrificial liner layer 25 are removed, storage openings 29A may be formed between the inter-cell dielectric layers 12. The storage openings 29A may be defined by the extension of the preliminary storage openings 27. The first liner layer 23 may cover the upper and lower surfaces of the second edges of the horizontal layer HL, and the side surfaces of the second edges of the horizontal layer HL may be exposed through the storage openings 29A. The second liner layer 24 may remain inside each of the storage openings 29A.

As described above, the sacrificial liner layer 25 having the seam 25S may be removed by a full recess process.

Figure 14:
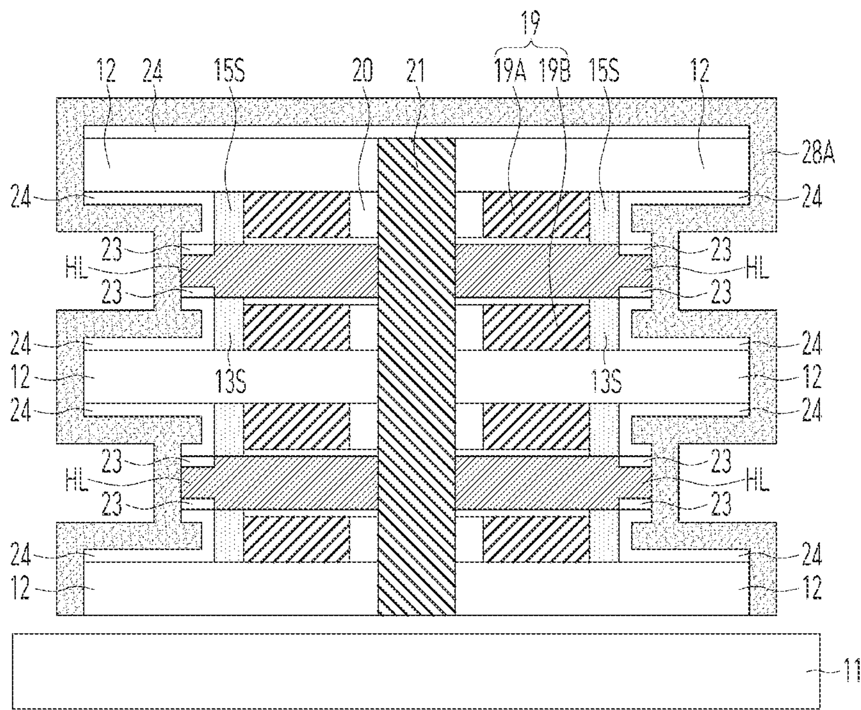

Referring to FIG. 14, an additional liner material, for example, a third liner material, may be formed on the second edge sides of the second liner layer 24, the first liner layer 23, and the horizontal layers HL. The third liner material 28A may include silicon nitride. The third liner material 28A may be conformally formed on the surface of the storage openings 29A. The third liner material 28A may not include a seam.

After the sacrificial liner layer 25 having the seam 25S is removed by a series of the processes as described above, a seam-free third liner material 28A may be formed.

Figure 15:
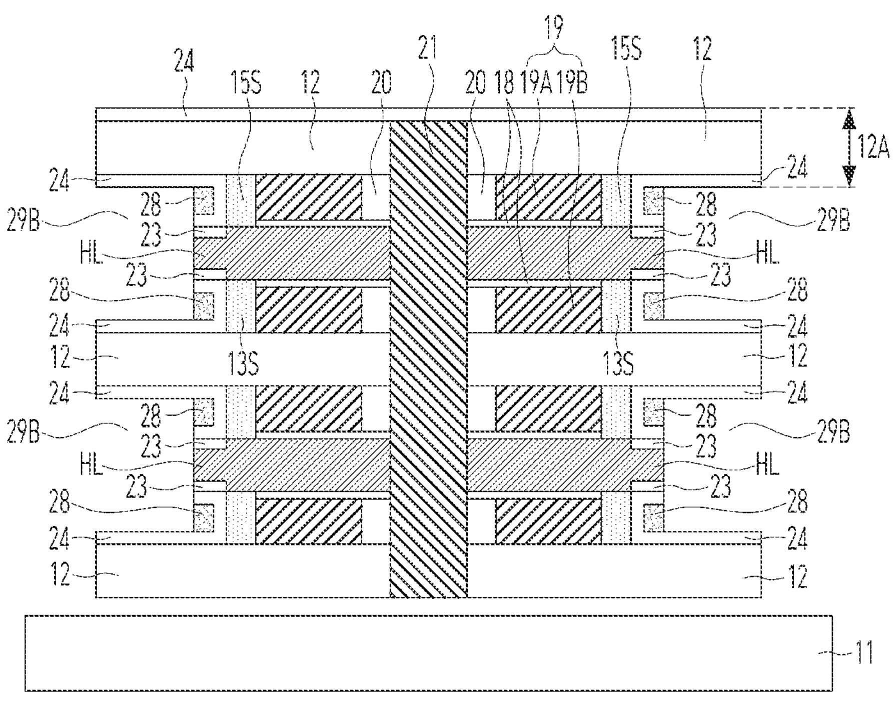

Referring to FIG. 15, a third liner layer 28 may be formed by etching back the third liner material 28A. The third liner layer 28 may fill the inner surface of the second liner layer 24. The volume of the storage openings, indicated by a reference numeral '29B', may be reduced due to the third liner layer 28. The storage openings 29B may be referred to as capacitor openings. The first liner layer 23 may cover the upper and lower surfaces of the second edges of the horizontal layer HL, and side surfaces of the second edges of the horizontal layer HL may be exposed through the storage openings 29B.

The first and second liner layers 23 and 24 may include silicon oxide, and the third liner layer 28 may include silicon nitride.

As described above, after the third liner layer 28 is formed, the second liner layer 24 may cover the upper and lower surfaces of the inter-cell dielectric layers 12 (refer to a reference numeral '12A'). The upper and lower surfaces of the inter-cell dielectric layers 12 may be prevented by the third liner layer 28 from being lost. As a result, since thinning of the inter-cell dielectric layers 12 is prevented or reduced, a space where the second electrode is to be formed may be secured sufficiently wide in a subsequent process.

Referring to a series of the processes illustrated in FIGS. 7 to 15, forming the second sacrificial layer level recesses 13R and 15R, sequentially forming the first liner material 23A, the second liner material 24A and the sacrificial liner material 25A, recessing the sacrificial liner material 25A to form the sacrificial liner layer 25, recessing the first and second liner materials 23A and 24A to form the first and second liner layers 23 and 24, forming the sacrificial covering layer 26, recessing the preliminary horizontal layers 14, removing the sacrificial liner layer 25, and forming the third liner material 28A may be sequentially performed. The series of the processes may be referred to as a 'channel post-recess scheme'.

As a comparative example, the channel pre-recess scheme may include, after horizontally recessing the preliminary horizontal layer 14, forming the second sacrificial layer level recesses 13R and 15R, sequentially forming a first liner material 23A, a second liner material 24A, and a third liner material 28A, recessing the third liner material 28A, and recessing the first and second liner materials 23A and 24A that are performed sequentially. In the channel recess pre-recess scheme like the comparative example, thinning of the inter-cell dielectric layers 12 may occur during the recess of the first and second liner materials 23A and 24A, and thus, a space where the second electrode is to be formed may be insufficient in a subsequent process.

Figure 16:
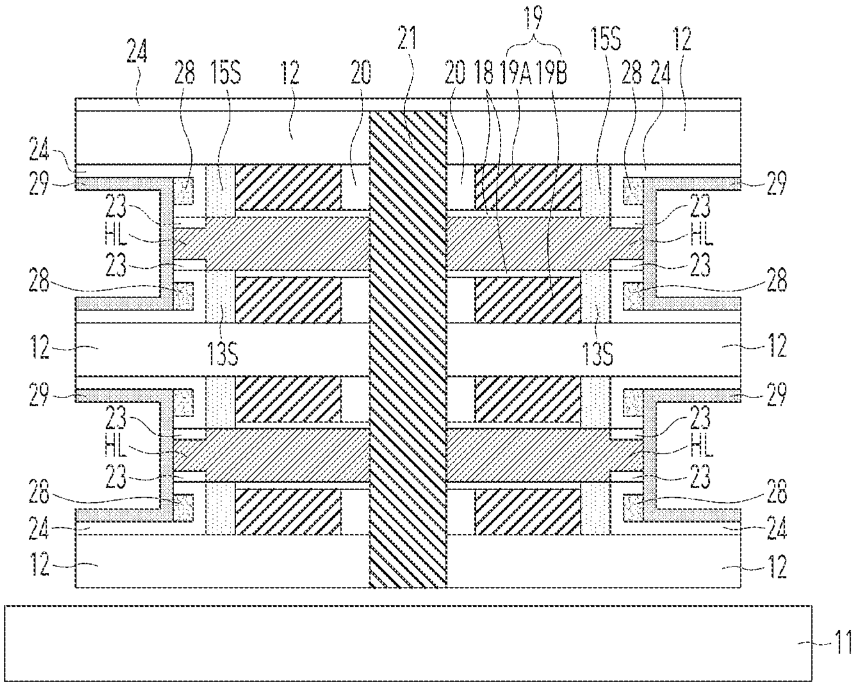

Referring to FIG. 16, the first electrode 29 of the data storage element may be formed on a side surface of the second edge of the horizontal layer HL. The first electrode 29 may be formed in the storage opening 29B. The first electrode 29 may have a horizontally oriented cylindrical shape.

Figure 17:
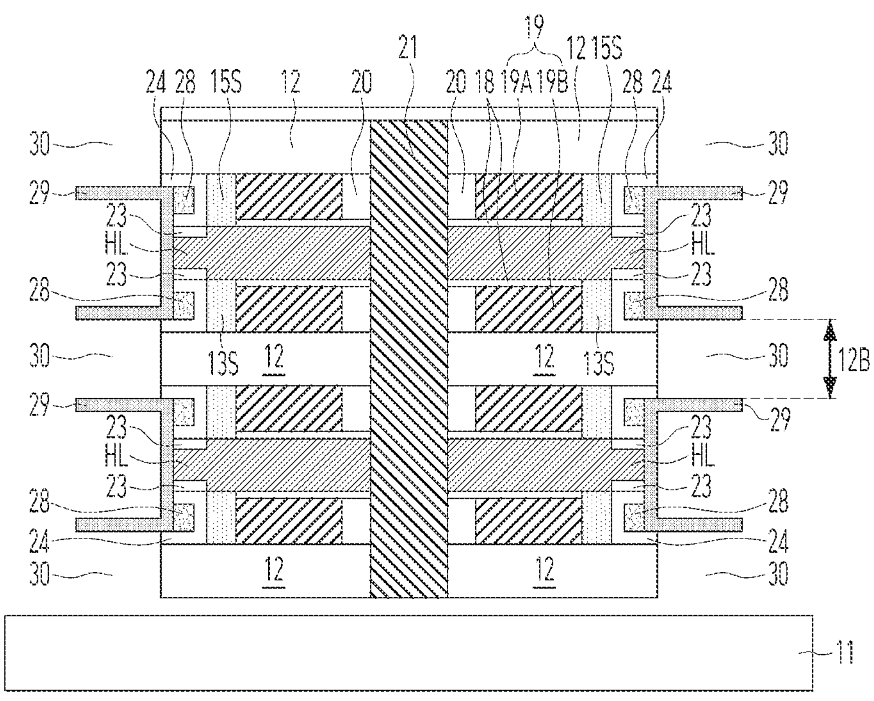

Referring to FIG. 17, inter-cell dielectric layer level recesses 30 exposing the outer walls of the first electrodes 29 may be formed by horizontally recessing the inter-cell dielectric layers 12 and the second liner material 24. The recessed inter-cell dielectric layers 12 may correspond to the inter-cell dielectric layers IL as illustrated in FIG. 2.

Figure 18:
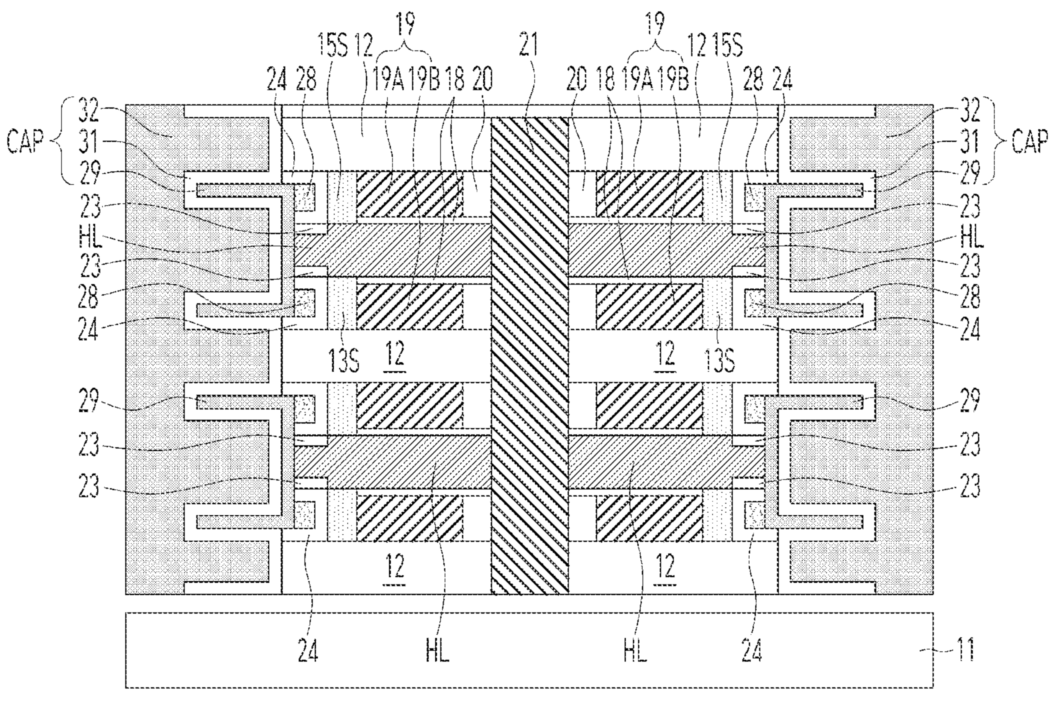

Referring to FIG. 18, a dielectric layer 31 and a second electrode 32 may be sequentially formed over the first electrodes 29. The first electrode 29, the dielectric layer 31, and the second electrode 32 may become a data storage element CAP.

Referring back to FIGS. 17 and 18, the inter-cell dielectric layer level recesses 30 may have a vertical height 12B. The vertical height 12B may be an interval between the vertically neighboring first electrodes 29. As such, the vertical height 12B of the inter-cell dielectric layer level recesses 30 may be able to provide a sufficiently wide space where the subsequent dielectric layer 31 and the second electrode 32 are to be formed.

In the comparative example such as the channel pre-recess scheme, the gap between the first electrodes 29 may be narrowed by the thinning of the inter-cell dielectric layers 12, and thus the vertical height 12B of the inter-cell dielectric layer level recesses 30 may be reduced. As a result, after the dielectric layer 31 is formed in the inter-cell dielectric layer level recesses 30, the space where the second electrode 32 is to be formed may be insufficient.

Referring back to FIG. 18, each first electrode 29 may include the inner space and a plurality of outer surfaces, and the inner space of the first electrode 29 may include a plurality of inner surfaces. The outer surfaces of the first electrode 29 may include a vertical outer surface and a plurality of horizontal outer surfaces. The inner space of the first electrode 29 may be a three-dimensional space. The dielectric layer 31 may conformally cover the inner and outer surfaces of the first electrode 29. The second electrode 32 may be disposed in the inner space of the first electrode 29 over the dielectric layer 31.

The first electrode 29 may have a cylindrical shape. The cylindrical shape of the first electrode 29 may include cylindrical inner surfaces and cylindrical outer surfaces. Some of the cylindrical outer surfaces of the first electrode 29 may be electrically connected to the horizontal layer HL. The dielectric layer 31 and the second electrode 32 may be disposed on the cylindrical inner surfaces of the first electrode 29.

The first electrode 29 and the second electrode 32 may include a metal, a noble metal, a metal nitride, a conductive metal oxide, a conductive noble metal oxide, a metal carbide, a metal silicide, or a combination thereof. For example, the first electrode 29 and the second electrode 32 may include one or more of titanium (Ti), titanium nitride (TiN), tantalum (Ta), tantalum nitride (TaN), tungsten (W), tungsten nitride (WN), ruthenium (Ru), ruthenium oxide ($RuO_2$), iridium (Ir), iridium oxide ($IrO_2$), platinum (Pt), molybdenum (Mo), molybdenum oxide (MoO), a titanium nitride/tungsten (TiN/W) stack, a tungsten nitride/tungsten (WN/W) stack, or a combination thereof. The second electrode 32 may include a combination of a metal-based material and a silicon-based material. For example, the second electrode 32 may be a stack of titanium nitride/silicon germanium/tungsten nitride (TiN/SiGe/WN). In the titanium nitride/silicon germanium/tungsten nitride (TiN/SiGe/WN) stack, silicon germanium may be a gap-fill material filling the inner space of the first electrode 29, and titanium nitride (TiN) may serve as the second electrode 32 of a data storage element CAP, and tungsten nitride may be a low-resistance material.

The dielectric layer 31 may be referred to as a capacitor dielectric layer or a memory layer. The dielectric layer 31 may include one or more of silicon oxide, silicon nitride, a high-k material, a ferroelectric material, an anti-ferroelectric material, or a combination thereof. The high-k material of the dielectric layer 31 may include one or more of hafnium oxide ($HfO_2$), zirconium oxide ($ZrO_2$), aluminum oxide ($Al_2O_3$), lanthanum oxide ($La_2O_3$), titanium oxide ($TiO_2$), tantalum oxide ($Ta_2O_5$), niobium oxide ($Nb_2O_5$) or strontium titanium oxide ($SrTiO_3$) or a combination thereof. The dielectric layer 29 may include one or more of a ZA ($ZrO_2/Al_2O_3$) stack, a ZAZ ($ZrO_2/Al_2O_3/ZrO_2$) stack, a ZAZA ($ZrO_2/Al_2O_3/ZrO_2/Al_2O_3$) stack, a ZAZAZ ($ZrO_2/Al_2O_3/ZrO_2/Al_2O_3/ZrO_2$) stack, an HA ($HfO_2/Al_2O_3$) stack, an HAH ($HfO_2/Al_2O_3/HfO_2$) stack, a HAHA ($HfO_2/Al_2O_3/HfO_2/Al_2O_3$) stack, or a HAHAH ($HfO_2/Al_2O_3/HfO_2/Al_2O_3/HfO_2$) stack or a combination thereof.

According to another embodiment of the present invention, an interface control layer for improving leakage current may be further formed between the first electrode 29 and the dielectric layer 31. The interface control layer may include one or more of titanium oxide ($TiO_2$), tantalum oxide ($Ta_2O_5$), niobium oxide ($Nb_2O_5$), niobium nitride (NbN), or a combination thereof. The interface control layer may also be formed between the second electrode 29 and the dielectric layer 31.

Since the third liner material 28A is re-deposited after the sacrificial liner material 25A having the seam 25S in FIGS. 3 to 18 is fully recessed, a seam-free third liner layer 28 may be formed. Accordingly, thinning of the inter-cell dielectric layers 12 may be prevented or reduced. Since the thinning of the inter-cell dielectric layers 12 is prevented, a sufficient space for forming the second electrode 32 may be secured. As a result, the capacitance of the data storage element CAP may be increased.

Figure 19A:
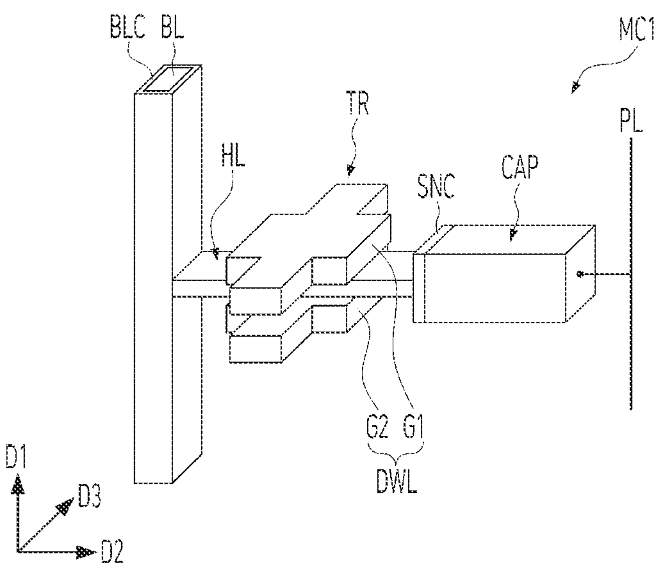
FIG. 19A is a schematic perspective view illustrating a memory cell in accordance with another embodiment of the present invention.
Figure 19B:
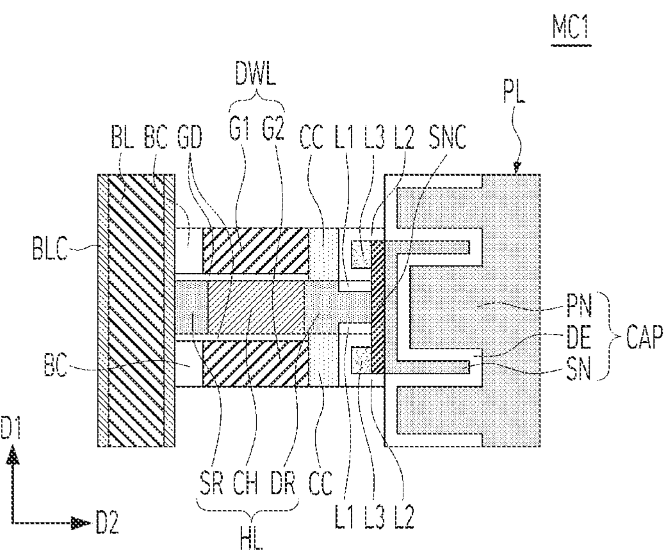
FIG. 19B is a schematic cross-sectional view illustrating the memory cell shown in FIG. 19A.
Figure 19C:
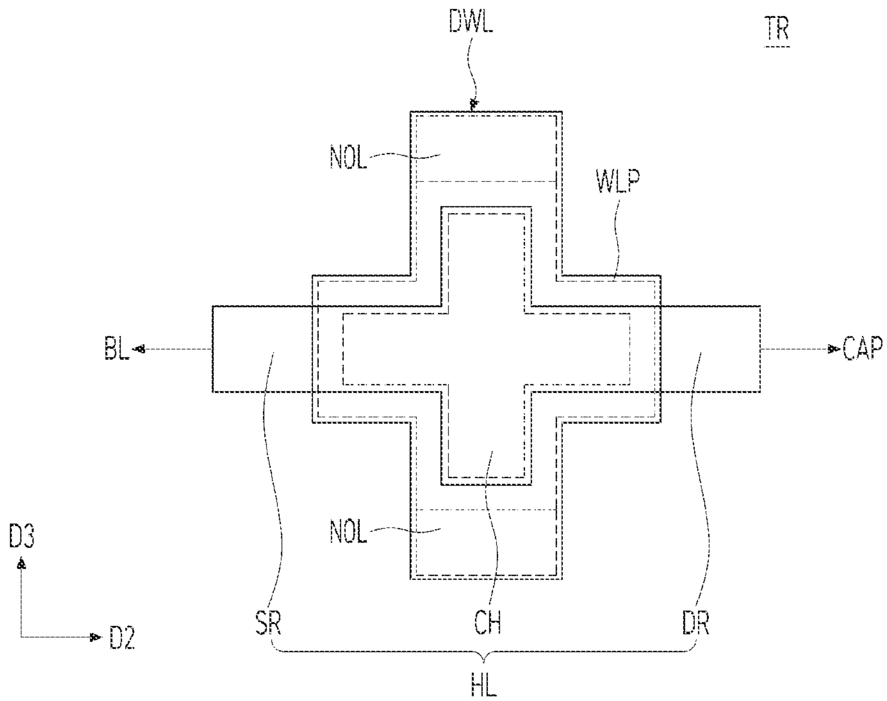
FIG. 19C is a plan view illustrating a switching element shown in FIG. 19A.

FIG. 19A is a schematic perspective view illustrating a memory cell in accordance with another embodiment of the present invention. FIG. 19B is a schematic cross-sectional view illustrating the memory cell shown in FIG. 19A. FIG. 19C is a plan view illustrating a switching element shown in FIG. 19A. The memory cell MC1 of FIGS. 19A and 19B may be similar to the memory cell MC of FIGS. 1A and 1B. Hereinafter, as for the detailed description of the constituent elements also appearing in FIGS. 1A and 1B, FIGS. 1A and 1B may be referred to.

Referring to FIGS. 19A to 19C, the memory cell MC1 may include a first conductive line BL, a switching element TR, and a data storage element CAP.

The first conductive line BL may be vertically oriented in the first direction D1. The first conductive line BL may include a bit line. The first conductive line BL may be referred to as a vertical conductive line, a vertically-oriented bit line, a vertically-extending bit line, or a pillar-shaped bit line. The first conductive line BL may include a conductive material. The first conductive line BL may include a silicon-based material, a metal-based material, or a combination thereof. The first conductive line BL may include one or more of polysilicon, a metal, a metal nitride, a metal silicide, or a combination thereof. The first conductive line BL may include polysilicon, titanium nitride, tungsten, or a combination thereof. For example, the first conductive line BL may include a stack of titanium nitride and tungsten (TiN/W).

The switching element TR may have a function of controlling voltage (or current) supply to the data storage element CAP in a data write operation and a data read operation of the data storage element CAP. The switching element TR may include a horizontal layer HL, an inter-level dielectric layer GD, and a second conductive line DWL. The second conductive line DWL may include a horizontal conductive line or a horizontal word line, and the horizontal layer HL may include an active layer. The switching element TR may include a transistor, and in this case, the second conductive line DWL may serve as a gate electrode. The switching element TR may also be referred to as an access element or a selection element. The second conductive line DWL may be referred to as a horizontal gate electrode or a horizontal word line.

The horizontal layer HL may extend in the second direction D2 crossing the first direction D1. The second conductive line DWL may extend in the third direction D3 crossing the first and second directions D1 and D2. The first direction D1 may be a vertical direction, and the second direction D2 may be a first horizontal direction, and the third direction D3 may be a second horizontal direction. The horizontal layer HL may extend in the first horizontal direction (i.e., the second direction D2), and the second conductive line DWL may extend in the second horizontal direction (i.e., the third direction D3).

The horizontal layer HL may include a semiconductor material. For example, the horizontal layer HL may include one or more of polysilicon, monocrystalline silicon, germanium, or silicon-germanium. According to another embodiment of the present invention, the horizontal layer HL may include an oxide semiconductor material. For example, the oxide semiconductor material may include indium gallium zinc oxide (IGZO). According to another embodiment of the present invention, the horizontal layer HL may include a conductive metal oxide.

The upper and lower surfaces of the horizontal layer HL may have flat surfaces. The upper and lower surfaces of the horizontal layer HL may be parallel to each other in the second direction D2.

The horizontal layer HL may include a channel CH, a first doped region SR between the channel CH and the first conductive line BL, and a second doped region DR between the channel CH and the data storage element CAP. When the horizontal layer HL is formed of an oxide semiconductor material, the channel CH may be formed of an oxide semiconductor material, and the first and second doped regions SR and DR may be omitted. The horizontal layer HL may also be referred to as an active layer or a thin-body.

The first doped region SR and the second doped region DR may be doped with impurities of the same conductivity type. The first doped region SR and the second doped region DR may be doped with an N-type impurity or a P-type impurity. The first doped region SR and the second doped region DR may include at least one impurity selected from among arsenic (As), phosphorus (P), boron (B), indium (In), and combinations thereof. The first doped region SR may be coupled to the first conductive line BL, and the second doped region DR may be coupled to the data storage element CAP. The first and second doped regions SR and DR may be referred to as first and second source/drain regions.

The horizontal layer HL may be horizontally oriented in the second direction D2 from the first conductive line BL.

The second conductive line DWL may have a double structure. For example, the second conductive line DWL may include an upper horizontal line G1 and a lower horizontal line G2 that are facing each other with the horizontal layer HL therebetween. An inter-level dielectric layer GD may be formed on the upper and lower surfaces of the horizontal layer HL. The upper horizontal line G1 may be disposed over the horizontal layer HL, and the lower horizontal line G2 may be disposed below the horizontal layer HL. The second conductive line DWL may include a pair of an upper horizontal line G1 and a lower horizontal line G2. In the second conductive line DWL, the same driving voltage may be applied to the upper horizontal line G1 and the lower horizontal line G2. For example, the upper horizontal line G1 and the lower horizontal line G2 may form a pair and may be coupled to one memory cell MC. According to another embodiment of the present invention, different driving voltages may be applied to the upper horizontal line G1 and the lower horizontal line G2. In this case, one of the upper horizontal line G1 and the lower horizontal line G2 may serve as a back gate or a shield gate.

The second conductive line DWL may include a metal-based material, a semiconductor material, or a combination thereof. The second conductive line DWL may include titanium nitride, tungsten, polysilicon, or a combination thereof. For example, the second conductive line DWL may include a TiN/W stack in which titanium nitride and tungsten are sequentially stacked. The second conductive line DWL may include an N-type work function material or a P-type work function material. The N-type work function material may have a low work function of for example approximately 4.5 eV or less, and the P-type work function material may have a high work function of for example approximately 4.5 eV or more. The second conductive line DWL may include a stack of a low work function material and a high work function material.

Each of the upper horizontal line G1 and the lower horizontal line G2 may have varying widths in the second direction D2. For example, the width of the upper and lower horizontal lines G1 and G2 may be greater at an overlapping portion where the upper and lower horizontal lines G1 and G2 overlap with the horizontal layer HL than at a non-overlapping portion where the upper and lower horizontal lines G1 and G2 do not overlap with the horizontal layer HL. Due to this difference in the widths, the sidewalls extending in the third direction D3 of the second conductive line DWL may have a notch-shaped sidewall.

Referring back to FIG. 19C, the second conductive line DWL may include a channel overlapping portion WLP and a channel non-overlapping portion NOL. The channel overlapping portion WLP may refer to a portion that overlaps with the channel CH of the horizontal layer HL, and the channel non-overlapping portion NOL may refer to a portion that does not overlap with the horizontal layer HL. The channel overlapping portion WLP may have a cross shape or a rhombus shape. According to another embodiment of the present invention, the side surfaces of the channel overlapping portion WLP may have a bent shape or a rounded shape.

The channel CH and the channel overlapping portion WLP of the second conductive line DWL may overlap with each other. The channel CH may have a cross shape or a rhombus shape. The size of the channel overlapping portion WLP of the second conductive line DWL may be greater than the size of the channel CH. The channel overlapping portion WLP of the second conductive line DWL may fully overlap with the channel CH.

From the perspective of a top view, the horizontal layer HL may have a cross shape or a rhombus shape. According to another embodiment of the present invention, the side surfaces of the horizontal layer HL may have a bent shape or a rounded shape.

The inter-level dielectric layer GD may be disposed between the horizontal layer HL and the second conductive line DWL. The inter-level dielectric layer GD may be referred to as a gate dielectric layer. The inter-level dielectric layer GD may be referred to as a horizontal layer-side dielectric layer. The inter-level dielectric layer GD may include one or more of silicon oxide, silicon nitride, a metal oxide, a metal oxynitride, a metal silicate, a high-k material, a ferroelectric material, an anti-ferroelectric material or a combination thereof. The inter-level dielectric layer GD may include one or more of $SiO_2$, $Si_3N_4$, $HfO_2$, $Al_2O_3$, $ZrO_2$, AlON, HfON, HfSiO, HfSiON, HfZrO, or a combination thereof. The inter-level dielectric layer GD may be formed by thermal oxidation of a semiconductor material.

The data storage element CAP may include a memory element, such as a capacitor. The data storage element CAP may be horizontally disposed in the second direction D2 from the switching element TR. The data storage element CAP may include a first electrode SN extending horizontally from the horizontal layer HL in the second direction D2. The data storage element CAP may further include a second electrode PN over the first electrode SN and a dielectric layer DE between the first electrode SN and the second electrode PN. The second electrode PN may be coupled to a common plate PL.

A first capping layer BC may be disposed between the first conductive line BL and the second conductive line DWL. A second capping layer CC may be disposed between the second conductive line DWL and the first electrode SN of the data storage element. The first capping layer BC may be disposed between the upper horizontal line G1 and the first conductive line BL, and the first capping layer BC may be disposed between the lower horizontal line G2 and the first conductive line BL. The second capping layer CC may be disposed between the upper horizontal line G1 and the first electrode SN of the data storage element CAP, and the second capping layer CC may be disposed between the lower horizontal line G2 and the first electrode SN of the data storage element CAP.

The first and second capping layers BC and CC may include a dielectric material. The first and second capping layers BC and CC may include one or more of silicon oxide, silicon nitride, silicon carbon oxide, an air gap, or a combination thereof. The first capping layer BC may include silicon oxide, and the second capping layer CC may include a stack of silicon oxide and silicon nitride.

A plurality of liner layers L1, L2, and L3 may be disposed between the first electrode SN of the data storage element and the second capping layer CC. The liner layers L1, L2, and L3 may include a first liner layer L1, a second liner layer L2, and a third liner layer L3. The first liner layers L1 may be disposed on the upper and lower surfaces of the edges of the horizontal layer HL. The second liner layers L2 may contact the second capping layers CC, and the third liner layers L3 may be disposed in the second liner layers L2. The first liner layers L1 and the second liner layers L2 may include silicon oxide, and the third liner layers L3 may include silicon nitride.

Figure 20:
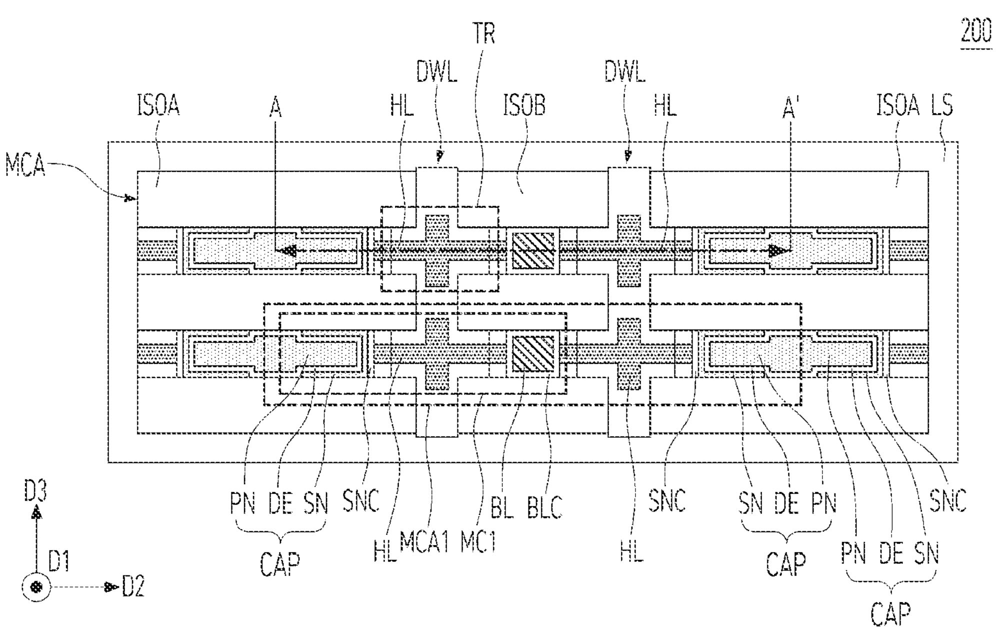
FIG. 20 is a schematic plan view illustrating a semiconductor device in accordance with another embodiment of the present invention.
Figure 21:
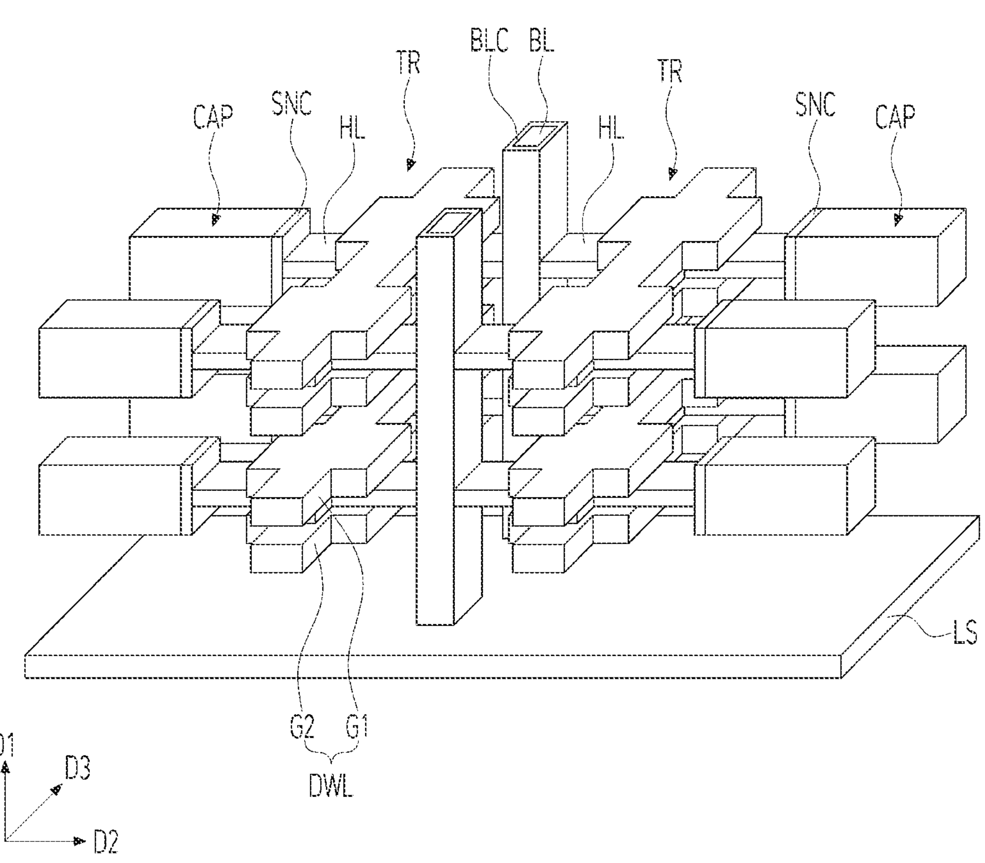
FIG. 21 is a schematic perspective view illustrating a first memory cell array MCA1 shown in FIG. 20.
Figure 22:
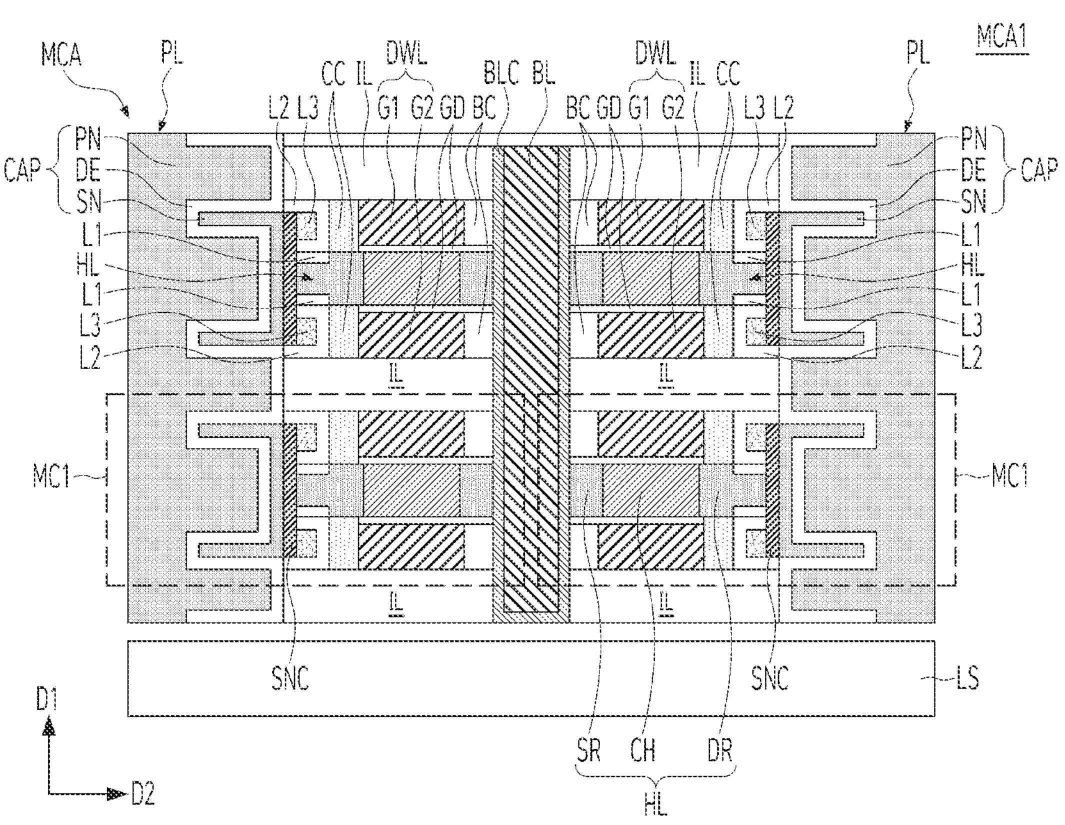
FIG. 22 is a cross-sectional view taken along a line A-A' in FIG. 20.

FIG. 20 is a schematic plan view illustrating a semiconductor device in accordance with another embodiment of the present invention. FIG. 21 is a schematic perspective view illustrating a first memory cell array MCA1 of FIG. 20. FIG. 22 is a cross-sectional view taken along a line A-A' in FIG. 20.

Referring to FIGS. 20, 21, and 22, the semiconductor device 200 may include a memory cell array MCA. The memory cell array MCA may include a plurality of memory cells MC1. As for the individual memory cells MC1, FIGS. 19A and 19B may be referred to. Each memory cell MC1 may include a first conductive line BL, a switching element TR, and a data storage element CAP.

The memory cell array MCA may include a three-dimensional array of memory cells MC1. The 3D array of the memory cells MC1 may include a column array of memory cells MC1 and a row array of memory cells MC1. The column array of memory cells MC1 may include a plurality of memory cells MC1 that are stacked in the first direction D1, and the row array of memory cells MC1 may include a plurality of memory cells MC1 that are horizontally disposed in the second direction D2 and the third direction D3. The memory cell array MCA may include sub-memory cell arrays MCA1 that are adjacent to each other in the second direction D2. The sub-memory cell array MCA1 may have a mirror-type structure where two memory cells MC1 share the first conductive line BL. According to another embodiment of the present invention, the semiconductor device 200 may further include sub-memory cell arrays having a mirror-like structure in which two memory cells MC share the second electrode PN of the data storage element CAP. The memory cell array MCA may include a plurality of sub-memory cell arrays MCA1 in which memory cells MC1 are vertically stacked in the first direction D1. The memory cell array MCA may include a plurality of sub-memory cell arrays MCA1 that are horizontally arranged in the third direction D3.

According to another embodiment of the present invention, in the memory cell array MCA, a plurality of sub-memory cell arrays MCA1 may be disposed in the second direction D2. For example, the data storage element CAP, the switching element TR, the first conductive line BL, and the switching element TR may be alternately disposed in the second direction D2 in the mentioned order.

Inter-cell dielectric layers IL may be disposed between the memory cells MC1 that are stacked in the first direction D1. The inter-cell dielectric layers IL may include silicon oxide. The inter-cell dielectric layers IL may be referred to as horizontal inter-cell dielectric layers.

Cell isolation layers ISOA and ISOB may be disposed between the memory cells MC1 neighboring in the third direction D3. The cell isolation layers ISOA and ISOB may be referred to as vertical inter-cell dielectric layers. The cell isolation layers ISOA and ISOB may include one or more of silicon oxide, silicon carbon oxide (SiCO), silicon nitride, or a combination thereof. The cell isolation layers ISOA and ISOB may include first cell isolation layers ISOA and second cell isolation layers ISOB. The first cell isolation layers ISOA and the second cell isolation layers ISOB may extend vertically in the first direction D1. The first cell isolation layers ISOA and the second cell isolation layers ISOB may have a pillar structure extending vertically in the first direction D1. The first cell isolation layers ISOA and the second cell isolation layers ISOB may be alternately and repeatedly disposed in the second direction D2. The first cell isolation layers ISOA may be disposed between the data storage elements CAP in the third direction D3. The second cell isolation layers ISOB may be disposed between the first conductive lines BL in the third direction D3. The second conductive lines DWL may be disposed between the first cell isolation layers ISOA and the second cell isolation layers ISOB in the second direction D2. Each of the first cell isolation layers ISOA and the second cell isolation layers ISOB may include a stack of a cell isolation liner layer and a cell isolation gap-fill layer. The cell isolation liner layers may include silicon oxide, and the cell isolation gap-fill layers may include silicon carbon oxide.

The memory cell array MCA may be disposed over the lower structure LS.

The memory cell array MCA may include a plurality of second conductive lines DWL that are vertically stacked in the first direction D1. The memory cell array MCA may include a plurality of horizontal layers HL that are vertically stacked in the first direction D1. The memory cell array MCA may include a plurality of data storage elements CAP that are vertically stacked in the first direction D1. The memory cell array MCA may include a plurality of first conductive lines BL that are spaced apart from each other in the third direction D3.

Each of the second conductive lines DWL may include a channel overlapping portion WLP and channel non-overlapping portions NOL as illustrated in FIG. 19C. The channel overlapping portion WLP may have a cross shape or a rhombus shape. The channel overlapping portion WLP may fully overlap with the channel CH. The second conductive line DWL extending in the third direction D3 may include a plurality of channel overlapping portions WLP. As the channel overlapping portions WLP and the channel non-overlapping portions NOL are alternately repeated in the third direction D3, the second conductive line DWL may have a notch-shaped sidewall.

The first conductive lines BL may extend vertically from the upper portion of the lower structure LS in the first direction D1. The horizontal layers HL may extend in the second direction D2 crossing the first direction D1. The second conductive lines DWL may extend in a third direction D3 crossing the first direction D1 and the second direction D2.

From the perspective of a top view, the horizontal layers HL may have a cross shape or a rhombus shape. According to another embodiment of the present invention, the side surfaces of the horizontal layer HL may have a bent shape or a round shape. Referring to FIGS. 19B and 19C, the horizontal layer HL may include the channel CH, the first doped region SR between the channel CH and the first conductive line BL, and a second doped region DR between the channel CH and the data storage elements CAP.

A first capping layer BC may be disposed between the second conductive line DWL and the first conductive line BL. A second capping layer CC may be disposed between the second conductive line DWL and the first electrode SN of the data storage element. The first capping layer BC may be disposed between the upper horizontal line G1 and the first conductive line BL, and the first capping layer BC may be disposed between the lower horizontal line G2 and the first conductive line BL. The second capping layer CC may be disposed between the upper horizontal line G1 and the first electrode SN of the data storage element CAP, and the second capping layer CC may be disposed between the lower horizontal line G2 and the first electrode SN of the data storage element CAP. One memory cell MC may include a pair of first capping layers BC and a pair of second capping layers CC.

The first and second capping layers BC and CC may include a dielectric material. The first and second capping layers BC and CC may include silicon oxide, silicon nitride, silicon carbon oxide, an air gap, or a combination thereof. The first capping layer BC may include silicon oxide, and the second capping layer CC may include a stack of silicon oxide and silicon nitride. According to another embodiment of the present invention, the first capping layer BC may include a stack of silicon oxide and silicon nitride.

A plurality of liner layers L1, L2, and L3 may be disposed between the first electrode SN of the data storage element and the second capping layer CC. The liner layers L1, L2, and L3 may include a first liner layer L1, a second liner layer L2, and a third liner layer L3. The first liner layers L1 may be disposed on the upper and lower surfaces of the edges of the horizontal layer HL. The second liner layers L2 may contact the second capping layers CC, and the third liner layers L3 may be disposed in the second liner layers L2. The first liner layers L1 and the second liner layers L2 may include silicon oxide, and the third liner layers L3 may include silicon nitride.

The memory cell MC1 may further include a first contact node BLC and a second contact node SNC. The first contact node BLC may surround an outer wall of the first conductive line BL. The second contact node SNC may be disposed between the horizontal layer HL and the first electrode SN. The first contact node BLC may include a metal-based material or a semiconductor material. The second contact node SNC may include a metal-based material or a semiconductor material. For example, the first and second contact nodes BLC and SNC may include one or more of titanium, titanium nitride, tungsten, or a combination thereof. Also, the first and second contact nodes BLC and SNC may include doped polysilicon, and the first doped region SR and the second doped region DR may include respectively impurities diffused from the first contact node BLC and the second contact node SNC.

The horizontal layers HL of the switching elements TR disposed horizontally in the third direction D3 may share one second conductive line DWL. The horizontal layers HL of the switching elements TR disposed horizontally in the third direction D3 may be coupled to different first conductive lines BL. The switching elements TR stacked in the first direction D1 may share one first conductive line BL. The switching elements TR disposed horizontally in the third direction D3 may share one second conductive line DWL.

The first cell isolation layers ISOA may be disposed between the first electrodes SN of the data storage elements CAP in the third direction D3. The first electrodes SN may be isolated from each other by the first cell isolation layers ISOA. The second electrodes PN of the data storage elements CAP may be coupled to the common plate PL.

The lower structure LS may include one or more of a semiconductor substrate, a metal interconnection structure, a dielectric structure, a conductive structure, a bonding pad structure, another memory or a peripheral circuit unit.

For example, the lower structure LS may include a structure in which a peripheral circuit unit, a metal interconnection structure, and a bonding pad structure are sequentially stacked. The memory cell array MCA and the peripheral circuit unit of the lower structure LS may be coupled by wafer bonding.

The peripheral circuit unit of the lower structure LS may be disposed at a lower level than the memory cell array MCA. This may be referred to as the above-noted COP structure. The peripheral circuit unit may include at least one control circuit for driving the memory cell array MCA. The at least one control circuit of the peripheral circuit unit may include an N-channel transistor, a P-channel transistor, a CMOS circuit, or a combination thereof. The at least one control circuit of the peripheral circuit unit may include an address decoder circuit, a read circuit, a write circuit, and the like. The at least one control circuit of the peripheral circuit unit may include a planar channel transistor, a recess channel transistor, a buried gate transistor, a fin channel transistor (FinFET), and the like.

For example, the peripheral circuit unit may include sub-word line drivers and a sense amplifier. The second conductive lines DWL may be coupled to the sub-word line drivers. The first conductive line BL may be coupled to the sense amplifier.

According to another embodiment of the present invention, the peripheral circuit unit may be disposed at a higher level than the memory cell array MCA. This may be referred to as the above-noted POC structure. In this case, the lower structure LS may include a first semiconductor substrate, and the peripheral circuit unit may include a second semiconductor substrate.

According to another embodiment of the present invention, the memory cell array MCA may include one or more of a Dynamic Random Access Memory (DRAM), an embedded DRAM, a NAND memory, a ferroelectric RAM (FeRAM), a Spin-Transfer Torque RAM (STTRAM), a Phase-Change RAM (PCRAM), or a Resistive RAM (ReRAM).

According to the embodiment of the present invention, it is possible to increase capacitance of a data storage element by preventing the inter-cell dielectric layers from becoming thin.

According to the embodiment of the present invention, the yield of 3D memory cells may be improved.

While the present invention has been described with respect to the specific embodiments, it will be apparent to those skilled in the art that various changes and modifications may be made without departing from the scope of the invention as disclosed herein. Furthermore, the embodiments may be combined to form additional embodiments.

What is claimed is:

1. A method for fabricating a semiconductor device, the method comprising:

forming a stack body by sequentially forming a first layer, a second layer, a third layer, a fourth layer, and a fifth layer over a lower structure;

forming an opening in the stack body;

forming a capping layer that exposes an edge of the third layer by horizontally recessing the second layer and the fourth layer from the opening;

forming a liner structure on the capping layer and an edge of the third layer;

forming a sacrificial liner material over the liner structure;

recessing the sacrificial liner material and the liner structure to expose the edge of the third layer;

forming a third layer pattern by recessing the exposed edge of the third layer; and forming a data storage element that is coupled to the third layer pattern.

2. The method of claim 1, further comprising:

before forming the third layer pattern, forming an additional liner material that covers the recessed sacrificial liner material and the recessed liner structure.

3. The method of claim 1, wherein forming the liner structure includes:

forming a first liner material on the edge of the third layer by an oxidation process; and conformally depositing a second liner material over the first liner material.

4. The method of claim 1, wherein the liner structure includes silicon oxide.

5. The method of claim 1, wherein the sacrificial liner material includes silicon nitride.

6. The method of claim 1, wherein forming the data storage element includes:

forming a first electrode that is coupled to the third layer pattern;

exposing an outer wall of the first electrode by selectively recessing the first layer, the fifth layer, and a portion of the liner structure;

forming a dielectric layer over the first electrode; and forming a second electrode over the dielectric layer.

7. The method of claim 1, wherein the data storage element includes a capacitor.

8. The method of claim 1, wherein the third layer includes a semiconductor material or an oxide semiconductor material.

9. The method of claim 1, wherein the third layer includes a monocrystalline silicon layer.

10. The method of claim 1, wherein the first layer and the fifth layer include silicon oxide, and the second layer and the fourth layer include silicon nitride.

11. A method for fabricating a semiconductor device, the method comprising:

forming a stack body by sequentially forming a first layer, a second layer, a third layer, a fourth layer, and a fifth layer over a lower structure;

forming a first opening in the stack body;

through the first opening, replacing a portion of the second layer and a portion of the fourth layer with horizontal conductive lines;

forming a vertical conductive line that is coupled to a first edge of the third layer while filling the first opening;

forming a second opening in the stack body;

forming a capping layer that exposes a second edge of the third layer by horizontally recessing the second layer and the fourth layer from the second opening;

forming a liner structure over the capping layer and the second edge of the third layer;

forming a sacrificial liner material over the liner structure;

recessing the sacrificial liner material and the liner structure to expose the second edge of the third layer;

forming a third layer pattern by recessing the exposed second edge of the third layer; and forming a data storage element that is coupled to the third layer pattern.

12. The method of claim 11, further comprising:

before forming the third layer pattern, forming an additional liner material that covers the recessed sacrificial liner material and the recessed liner structure.

13. The method of claim 11, wherein forming the liner structure includes:

forming a first liner material over the second edge of the third layer by an oxidation process; and depositing a second liner material conformally over the first liner material.

14. The method of claim 11, wherein the liner structure includes silicon oxide.

15. The method of claim 11, wherein the sacrificial liner material includes silicon nitride.

16. The method of claim 11, wherein forming the data storage element includes:

forming a first electrode that is coupled to the third layer pattern;

exposing an outer wall of the first electrode by selectively recessing the first layer, the fifth layer, and a portion of the liner structure;

forming a dielectric layer over the first electrode; and forming a second electrode over the dielectric layer.

17. The method of claim 11, wherein the data storage element includes a capacitor.

18. The method of claim 11, wherein the third layer includes a semiconductor material or an oxide semiconductor material.

19. The method of claim 11, wherein the third layer includes a monocrystalline silicon layer.

20. The method of claim 11, wherein the first layer and the fifth layer include silicon oxide, and the second layer and the fourth layer include silicon nitride.

* * * * *